US012743371B2

(12) United States Patent
Jung et al.

(10) Patent No.: US 12,743,371 B2
(45) Date of Patent: Sep. 22, 2026

(54) INPUT CIRCUIT, MEMORY INTERFACE CIRCUIT AND MEMORY SYSTEM

(71) Applicant: Samsung Electronics Co., Ltd., Suwon-si (KR)

(72) Inventors: Dongkyu Jung, Suwon-si (KR); Anil Kavala, Suwon-si (KR); Youngmin Jo, Suwon-si (KR); Chiweon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 19/014,983

(22) Filed: Jan. 9, 2025

(65) Prior Publication Data

US 2025/0307136 A1 Oct. 2, 2025

(30) Foreign Application Priority Data

Mar. 27, 2024 (KR) ........................ 10-2024-0042123

(51) Int. Cl.

| | |
|---|---|
| ***G06F 12/02*** | (2006.01) |
| ***G11C 16/04*** | (2006.01) |
| ***G11C 16/32*** | (2006.01) |

(52) U.S. Cl.

CPC .......... *G06F 12/0246* (2013.01); *G11C 16/32* (2013.01); *G11C 16/0483* (2013.01)

(58) Field of Classification Search

CPC ......... G06F 12/0246; G06F 2212/1016; G06F 2212/1028; G06F 2212/7203; G06F 2212/7206; G06F 2212/7208; G06F 3/061; G06F 3/0658; G11C 16/32; G11C 16/0483; G11C 29/025; G11C 29/50008; G11C 29/028; G11C 7/1084; G11C 7/222; G11C 2207/2254

See application file for complete search history.

(56) References Cited

U.S. PATENT DOCUMENTS

| | | | | |
|---|---|---|---|---|
| 9,305,622 | B1 * | 4/2016 | Jeter | G11C 7/222 |
| 9,368,164 | B2 | 6/2016 | Venkatesan et al. | |
| 9,405,678 | B2 | 8/2016 | Zerbe et al. | |
| 9,780,763 | B1 | 10/2017 | Lu et al. | |
| 9,965,008 | B2 | 5/2018 | Tell | |
| 9,984,740 | B1 | 5/2018 | Hiraishi | |
| 10,965,440 | B1 | 3/2021 | Chen et al. | |
| 10,972,248 | B2 | 4/2021 | Lee et al. | |
| 11,736,098 | B2 | 8/2023 | Kim et al. | |
| 2005/0141330 | A1 * | 6/2005 | Shin | G11C 7/1066 365/233.1 |
| 2007/0217559 | A1 * | 9/2007 | Stott | H04L 7/0008 375/355 |
| 2008/0068904 | A1 * | 3/2008 | Hughes | G11C 7/1066 365/193 |
| 2021/0141747 | A1 * | 5/2021 | Jeong | G06F 13/1673 |
| 2023/0129949 | A1 | 4/2023 | Lee et al. | |

* cited by examiner

*Primary Examiner* — Jason W Blust

(74) *Attorney, Agent, or Firm* — Fish & Richardson P.C.

(57) ABSTRACT

An input circuit includes a first input buffer connected to a corresponding data pin, a second input buffer connected to a data strobe pin, and a repeater configured to delay an output signal of the first input buffer, and further includes a first loop configured to correct a voltage offset of each of the first input buffer and the second input buffer, and a second loop configured to correct a delay offset of the repeater.

20 Claims, 12 Drawing Sheets

FIG. 2

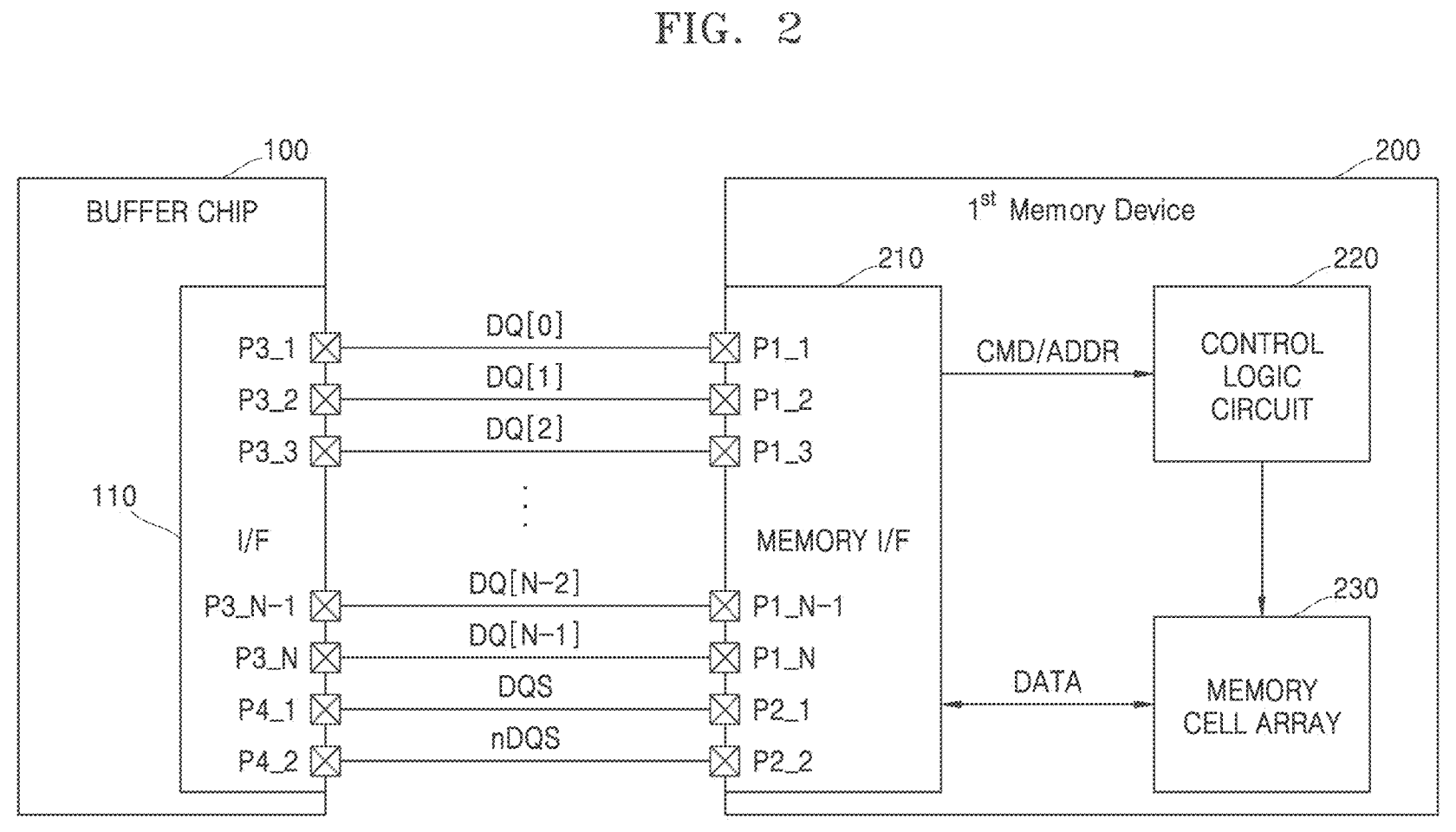

200
1st Memory Device
220
CONTROL LOGIC CIRCUIT
230
MEMORY CELL ARRAY
CMD/ADDR
DATA
210
MEMORY I/F
P1_1
P1_2
P1_3
P1_N-1
P1_N
P2_1
P2_2
DQ[0]
DQ[1]
DQ[2]
DQ[N-2]
DQ[N-1]
DQS
nDQS
100
BUFFER CHIP
I/F
P3_1
P3_2
P3_3
P3_N-1
P3_N
P4_1
P4_2
110

211_1
CMD1 CAL1
CLK_CAL CMD2 CAL2
61
CLK_CAL
CAL2
DQ[0]
51
1st Latch
VOC
1st Calibration Logic Circuit
DOC
55
3rd Latch
VOC
CAL1
S1
DQBUF
41
DOC
31
70
SDQ[0]
1st Repeater
Flip-Flop
VREF
CAL1
S2
21
CMD1
CAL1
53
2nd Latch
VOC
2nd Calibration Logic Circuit
CLK_CAL
63
CLK_CAL
CAL2
DQS
VOC
43
CAL1
S3
DQSBUF
33
2nd Repeater
65
CLKb_CAL
CAL2
nDQs
CAL1
S4
23

211_1
CLK_CAL CMD1 CAL1
51
1st Latch
VOC
1st Calibration Logic Circuit
41
55
3rd Latch
61
CLK_CAL
CAL2
DQ[0] (Floating)
VGND
VOC
CAL1
S1
DQBUF
31
1st Repeater
70
Flip-Flop
SDQ[0]
VREF (Floating)
VGND
CAL1
S2
21
CMD1 CAL1
53
2nd Latch
VOC
2nd Calibration Logic Circuit
CLK_CAL
43
63
CLK_CAL
CAL2
DQS (Floating)
VGND
VOC
CAL1
S3
DQSBUF
33
2nd Repeater
65
CLKb_CAL
CAL2
nDQs (Floating)
VGND
CAL1
S4
23
[1st Phase]

211_1
SDQ[0]
70
Flip-Flop
55
3rd Latch
DOC
31
1st Repeater
33
2nd Repeater
CLK_CAL CMD2 CAL2
41
1st Calibration Logic Circuit
43
2nd Calibration Logic Circuit
[2nd Phase]
51
1st Latch
53
2nd Latch
21
DQBUF
23
DQSBUF
CLK_CAL
CAL1
S1
VREF
S2
S3
CLKb_CAL
S4
61
63
65
CLK_CAL
CAL2
DQ[0] (Floating)
VREF
DQS (Floating)
CLKb_CAL
nDQs (Floating)

1500
CELL2
CELL1
PERI
WLBA
BLBA
THV1
THV2
A1
A2
B1
B2
C1
C2
C3
D1
D2
D3

INPUT CIRCUIT, MEMORY INTERFACE CIRCUIT AND MEMORY SYSTEM

CROSS-REFERENCE TO RELATED APPLICATION

This application is based on and claims priority under 35 U.S.C. § 119 to Korean Patent Application No. 10-2024-0042123, filed on Mar. 27, 2024, in the Korean Intellectual Property Office, the disclosure of which is incorporated by reference herein in its entirety.

BACKGROUND

The inventive concepts relate to input circuits, memory interface circuits, and memory systems, and more particularly, to memory systems including a buffer chip.

Advances in memory technology have led to the development of memory systems capable of writing and reading large amounts of data. In such a memory system, a plurality of memory devices are connected to a memory controller included in the memory system so that memory operations including write and read operations may be performed.

SUMMARY

The inventive concepts relate to input circuits capable of performing self-training on a voltage offset and a delay offset of a write path of a memory device during a training operation, memory interface circuits including the input circuit, and memory systems including the input circuit.

According to some aspects of the inventive concepts, there is provided a memory system including a buffer chip, a memory controller configured to transmit and receive a data strobe signal and a data signal to and from the buffer chip, and a plurality of non-volatile memory devices configured to transmit and receive the data strobe signal and the data signal to and from the buffer chip, in which each non-volatile memory device includes a memory interface circuit, including a plurality of data pins and a data strobe pin, each data pin is connected to a corresponding data signal line, the data signal line configured to carry one of bit values for each bit position of the data signal, and the data strobe pin is connected to a data strobe signal line configured to carry the data strobe signal. The memory interface circuit further includes a plurality of input circuits, and each input circuit includes a first input buffer connected to a corresponding data pin, a second input buffer connected to the data strobe pin, and a repeater configured to delay an output signal of the first input buffer, and further includes a first loop configured to correct a voltage offset of each of the first input buffer and the second input buffer, and a second loop configured to correct a delay offset of the repeater.

According to some aspects of the inventive concepts, there is provided a memory interface circuit including a plurality of data pins and a data strobe pin, in which each data pin is connected to a corresponding data signal line, the data signal line configured to carry one of bit values for each bit position of the data signal, and the data strobe pin is connected to a data strobe signal line configured to carry a data strobe signal. The memory interface circuit further includes a plurality of input circuits, and each input circuit includes a first input buffer connected to a corresponding data pin, a second input buffer connected to the data strobe pin, and a repeater configured to delay an output signal of the first input buffer, and further includes a first loop configured to correct a voltage offset of each of the first input buffer and the second input buffer, and a second loop configured to correct a delay offset of the repeater.

According to some aspects of the inventive concepts, there is provided an input circuit including a first input buffer connected to a corresponding data pin, a second input buffer connected to a data strobe pin, and a repeater configured to delay an output signal of the first input buffer, and further including a first loop configured to correct a voltage offset of each of the first input buffer and the second input buffer, and a second loop configured to correct a delay offset of the repeater.

BRIEF DESCRIPTION OF THE DRAWINGS

Embodiments will be more clearly understood from the following detailed description taken in conjunction with the accompanying drawings in which:

FIG. 2 is a block diagram of a buffer chip and a first memory device according to the inventive concept;

DETAILED DESCRIPTION OF THE EMBODIMENTS

Hereinafter, various embodiments will be described in detail with reference to the accompanying drawings.

Figure 1:
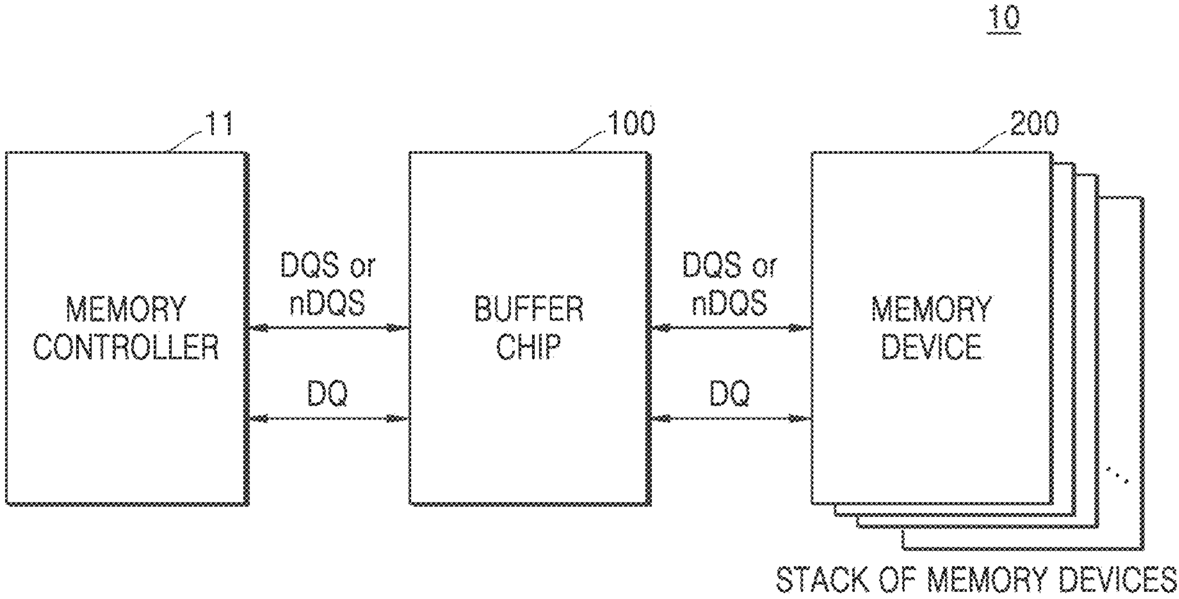
FIG. 1 is a block diagram illustrating a memory system according to some example embodiments.

FIG. 1 is a block diagram illustrating a memory system 10 according to some example embodiments.

Referring to FIG. 1, the memory system 10 according to some example embodiments may include a memory controller 11, a buffer chip 100, or a memory device 200. The memory system 10 may also be referred to as a storage device.

In some example embodiments, the memory controller 11 may be connected to the buffer chip 100 to transmit and receive a first or second data strobe signal DQS or nDQS or a data signal DQ. The memory controller 11 according to some example embodiments may be included in a host (not shown) of the memory system 10. The memory controller 11 according to some example embodiments may generate the first or second data strobe signal DQS or nDQS or the data signal DQ to perform a write or read operation on the memory device 200 and may transmit the generated first or second data strobe signal DQS or nDQS or data signal DQ to the buffer chip 100. In addition, the memory controller 11 according to some example embodiments may generate and transmit a plurality of commands or request signals for controlling the memory device 200. The data signal DQ according to some example embodiments may be provided through N pins. N may be a positive integer. According to some example embodiments, the memory controller 11 may transmit and receive the first or second data strobe signal DQS or nDQS to and from the buffer chip 100.

The buffer chip 100 according to some example embodiments may connect the memory controller 11 to the memory device 200. The buffer chip 100 according to some example embodiments may be an interface circuit. For example, the buffer chip 100 may receive the first or second data strobe signal DQS or nDQS or the data signal DQ from the memory controller 11, may correct the received first or second data strobe signal DQS or nDQS or data signal DQ, and may transmit the corrected first data strobe signal DQS or data signal DQ to the memory device 200. The corrected data signal DQ according to some example embodiments may be provided through N pins. Here, N may be a positive integer.

That is, the buffer chip 100 may transmit signals between the memory controller 11 and the memory device 200. The buffer chip 100 may provide a serializer/deserializer SERDES function branching a signal transmission path between a narrow interface with the memory controller 11 and a wide interface with a plurality of memory devices. For example, the narrow interface may provide 8-bit data input/output, and the wide interface may provide 64-bit data input/output.

In some example embodiments, the buffer chip 100 may transmit a command, an address, and/or data to a channel designated by the signals received from the memory controller 11 among a plurality of channels. The buffer chip 100 may include a plurality of ports including a receiver and a driver, and each port may include an on-die termination (ODT) resistor. The buffer chip 100 performs interfacing to provide a frequency, timing, and/or driving of signals required for efficient communication between the memory controller 11 and a plurality of memory devices, thereby increasing a data input and output speed of the memory device 200 and improving signal characteristics of the memory device 200. The buffer chip 100 may also be referred to as a frequency booting interface (FBI) buffer. Therefore, the improved devices and methods overcome the deficiencies of the conventional devices and methods of memory device usage, particularly related to chip interface training, while reducing resource consumption (e.g., processing capability, power, bandwidth), improving data accuracy, and resource allocation (e.g., latency).

The memory device 200 according to some example embodiments may include a plurality of non-volatile memory devices, and each of the plurality of non-volatile memory devices may be connected to the buffer chip 100. The memory device 200 according to some example embodiments may include a solid state drive (SSD) device. However, the memory device 200 is not limited thereto, and may include a plurality of non-volatile memory devices or volatile memory devices. For example, the memory device 200 may include a non-volatile memory device such as NAND flash memory, vertical NAND flash memory, NOR flash memory, resistive random access memory (RRAM), phase-change memory, or magneto-resistive random access memory (MRAM). The memory device 200 according to some example embodiments may include volatile memory such as dynamic random access memory (DRAM), mobile DRAM, static random access memory (SRAM), phase-change random access memory (PRAM), ferroelectric random access memory (FRAM), RRAM, and/or MRAM.

According to some example embodiments, the plurality of non-volatile memory devices may transmit and receive the first or second data strobe signal DQS or nDQS and the data signal DQ to and from the buffer chip 100. Each non-volatile memory device may include a memory interface circuit 210 (refer to FIG. 2). The memory interface circuit may include a plurality of data pins and data strobe pins. Here, the data strobe pin may be connected to a data strobe signal line carrying the first or second data strobe signal DQS or nDQS. In addition, each data pin may be connected to a corresponding data signal line, and the data signal line may carry one of bit values for each bit position of the data signal DQ. One data bit may be transmitted and received for each data pin. That is, the non-volatile memory device may perform per-pin data transmission and reception, and may transmit and receive one data bit for each data pin. In other words, the non-volatile memory device may perform data transmission in parallel.

According to the inventive concepts, while the memory device 200 operates in the training mode, input circuits included in the memory device 200 may correct a voltage offset and a delay offset of a write path included in each of the plurality of input circuits without feedback from the memory controller 11. For example, the memory device 200 may operate independently of (e.g., without instruction from) the memory controller 11 to correct a voltage and/or delay offset.

In addition, while the memory device 200 performs ZQ calibration, the input circuits included in the memory device 200 may independently correct the voltage offset of the write path included in each of the input circuits. In addition, while the memory device 200 performs DCC training, the input circuits may independently correct the delay offset of the write path included in each of the input circuits in parallel. Accordingly, training operation time of the memory device 200 may not be further increased. which will be described in detail with reference to FIGS. 2 to 9.

FIG. 2 is a block diagram of a buffer chip 100 and a first memory device 200-1 according to the inventive concepts.

FIG. 2 is a diagram illustrating only the buffer chip 100 included in the memory system 10 and the first memory device 200-1 among a plurality of memory devices.

When the memory device 200 described in FIG. 1 is implemented with the plurality of memory devices, each of the plurality of memory devices may have the same configuration. Accordingly, hereinafter, a configuration and operation of the first memory device 200-1 illustrated in FIG. 2 will be described.

Referring to FIG. 2, the first memory device 200-1 may include first to Nth data pins P1_1 to P1_N and first and second data strobe pins P2_1 and P2_2, a memory interface circuit 210, a control logic circuit 220, and a memory cell array 230.

The memory interface circuit 210 may receive or transmit first to Nth data signals DQ[0] to DQ[N−1] from or to the memory controller 11 through the first to Nth data pins P1_1 to P1_N. A command CMD, an address ADDR, and data DATA may be transmitted through the first to Nth data signals DQ[0] to DQ[N−1]. For example, each of the first to Nth data signals DQ[0] to DQ[N−1] may be transmitted through a corresponding data signal line. For example, the first data pin P1_1 may be connected to the first data signal line, and the second data pin P1_2 may be connected to the second data signal line.

The memory interface circuit 210 may receive or transmit the first or second data strobe signal DQS or nDQS from or to the memory controller 11 through a data strobe pin.

Referring to FIG. 2, according to some example embodiments, phases of the first data strobe signal DQS and the second data strobe signal nDQS may be opposite to each other.

In addition, the memory interface circuit 210 may receive or transmit the first data strobe signal DQS from or to the memory controller 11 through the first data strobe pin P2_1. In addition, the memory interface circuit 210 may receive or transmit the second data strobe signal nDQS from or to the memory controller 11 through the second data strobe pin P2_2.

However, the first memory device 200-1 may include other pins in addition to the first to Nth data pins P1_1 to P1_N and the first and second data strobe pins P2_1 and P2_2 illustrated in FIG. 2. For example, the first memory device 200-1 may include at least one of a pin receiving a chip enable signal nCE, a pin receiving a command latch enable signal CLE, a pin receiving an address latch enable signal ALE, a pin receiving a write enable signal nWE, a pin receiving a read enable signal nRE, and a pin receiving a ready/busy output signal nR/B.

In a data input operation of the first memory device 200-1, when the first to Nth data signals DQ[0] to DQ[N−1] including the data DATA are received from the buffer chip 100, the memory interface circuit 210 may receive the first or second data strobe signal DQS or nDQS toggling with the data DATA from the buffer chip 100. The memory interface circuit 210 may obtain the data DATA from the first to Nth data signals DQ[0] to DQ[N−1] based on toggle timing of the first or second data strobe signal DQS or nDQS. For example, the memory interface circuit 210 may obtain the data DATA by sampling the first to Nth data signals DQ[0] to DQ[N−1] at rising and falling edges of the first or second data strobe signal DQS or nDQS.

The control logic circuit 220 may generally control various operations of the first memory device 200-1. The control logic circuit 220 may receive the command/address CMD/ADDR obtained from the memory interface circuit 210. The control logic circuit 220 may generate control signals for controlling other components of the first memory device 200-1 according to the received command/address CMD/ADDR. For example, the control logic circuit 220 may program the data DATA to the memory cell array 230 or may generate various control signals for reading the data DATA from the memory cell array 230.

The memory cell array 230 may store the data DATA obtained from the memory interface circuit 210 under the control of the control logic circuit 220. The memory cell array 230 may output the stored data DATA to the memory interface circuit 210 under the control of the control logic circuit 220.

The memory cell array 230 may include a plurality of memory cells. For example, the plurality of memory cells may be flash memory cells. However, the inventive concepts are not limited thereto, and the memory cells may be RRAM cells, FRAM cells, PRAM cells, thyristor random access memory (TRAM) cells, or MRAM cells.

Hereinafter, embodiments of the inventive concepts will be described focusing on some example embodiments in which the memory cells are NAND flash memory cells.

The buffer chip 100 may include first to Nth data pins P3_1 to P3_N and first and second data strobe pins P4_1 and P4_2, and an interface circuit 110. In addition, although not shown in FIG. 2, the buffer chip 100 may further include an interface circuit connected to the memory controller 11.

The first memory device 200-1 may include the first to Nth data pins P1_1 to P1_N and the first and second data strobe pins P2_1 and P2_2, the memory interface circuit 210, the control logic circuit 220, and the memory cell array 230.

The first to Nth data pins P3_1 to P3_N of the buffer chip 100 may correspond to the first to Nth data pins P1_1 to P1_N of the first memory device 200-1. The first to Nth data pins P3_1 to P3_N may be commonly connected to the plurality of memory devices.

In the data input operation of the first memory device 200-1, the memory controller 11 illustrated in FIG. 1 may generate the first or second data strobe signal DQS or nDQS that toggles. For example, the memory controller 11 may generate the first or second data strobe signal DQS or nDQS changing from a fixed state (for example, a high or low level) to a toggle state before transmitting the data DATA. The memory controller 11 may transmit the first to Nth data signals DQ[0] to DQ[N−1] including the data DATA to the first memory device 200-1 through the buffer chip 100 based on the toggle timing of the first or second data strobe signal DQS or nDQS.

Figure 3:
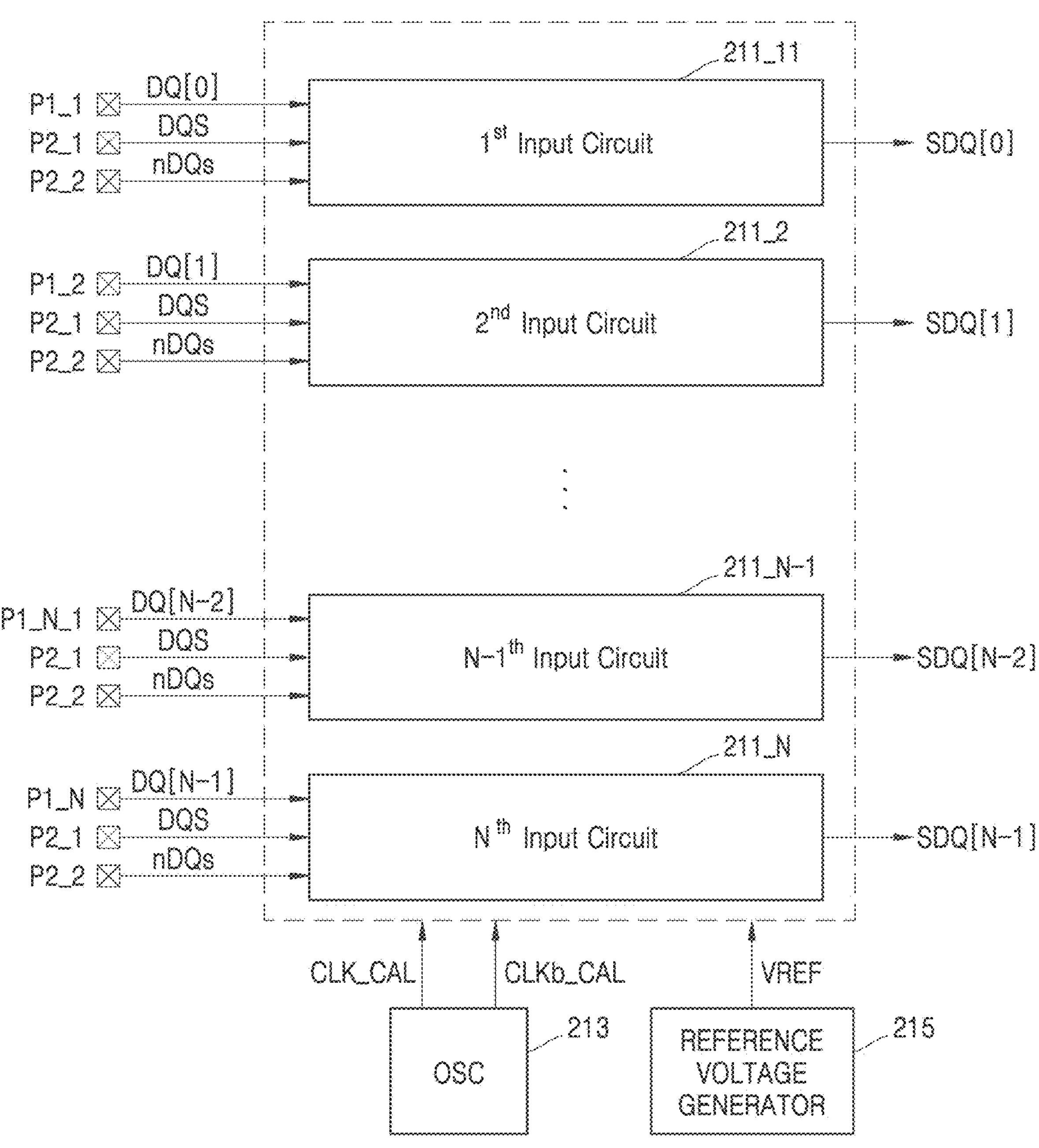
FIG. 3 is a block diagram illustrating an example of a memory interface circuit illustrated in FIG. 2.

FIG. 3 is a block diagram illustrating an example of the memory interface circuit 210 illustrated in FIG. 2. Hereinafter, the first memory device 200-1 of FIG. 2 will be referred to as the memory device 200.

Referring to FIG. 3, the memory interface circuit 210 may include a memory input interface circuit 211, an oscillator 213, and a reference voltage generator 215.

The memory input interface circuit 211 may include a plurality of input circuits. According to some example embodiments, the number of input circuits may correspond to the number of data pins of the memory device 200. For example, when the data signal DQ is provided through N pins, the number of input circuits may be N. Here, N may be a positive integer.

The oscillator 213 may provide a calibration clock signal to the memory input interface circuit 211 in a first period 1st phase and a second period 2nd phase to be described later while the memory device 200 is operating in a training mode. Referring to FIG. 3, the calibration clock signal may include a first calibration clock signal CLK_CAL and a second calibration clock signal CLKb_CAL. Here, phases of the first calibration clock signal CLK_CAL and the second calibration clock signal CLKb_CAL may be opposite to each other. For example, the oscillator 213 may provide the first calibration clock signal CLK_CAL and the second calibration clock signal CLKb_CAL to first to Nth input circuits 211_1 to 211_N.

The reference voltage generator 215 may generate a reference voltage VREF and may provide the reference voltage VREF to the memory device 200. According to some example embodiments, the reference voltage generator 215 may generate the reference voltage VREF corresponding to a reference voltage code signal in response to a reference voltage code signal, and may provide the reference voltage VREF to the memory input interface circuit 211. For example, the reference voltage generator 215 may provide the reference voltage VREF to the first to Nth input circuits 211_1 to 211_N.

Meanwhile, when the memory system 10 is powered up, the memory controller 11 and the memory device 200 may perform an initial setting operation according to a predetermined (or, alternatively, selected or desired) method. Default operation parameters may be set during initialization of the memory device 200. Thereafter, the memory system 10 may perform an operation in the training mode. For example, the memory system 10 may perform a command address training operation. In addition, the memory system 10 may perform a read training operation. The memory system 10 may perform a write training operation. After the initialization and training operations are performed, the memory system 10 may operate in a normal mode.

First, a case in which the memory device 200 operates in the normal mode will be described.

Each input circuit may compare a data signal received from a corresponding data pin with the reference voltage VREF received from the reference voltage generator to output a sampled data signal. For example, the first input circuit 211_1 may compare a first data signal DQ[0] received from the first data pin P1_1 with the reference voltage VREF received from the reference voltage generator 215 to output a sampled first data signal SDQ[0].

In addition, each input circuit may output a sampled data signal in synchronization with the first or second data strobe signal DQS or nDQS received from a data strobe pin. For example, the first input circuit 211_1 may output the sampled data signal SDQ[0] in synchronization with the first data strobe signal DQS received from the first data strobe pin or the second data strobe signal nDQS received from the second data strobe pin.

That is, each input circuit may compare the data signal received from the corresponding data pin with the reference voltage VREF received from the reference voltage generator and may sample the comparison result in synchronization with the first or second data strobe signal DQS or nDQS received from the data strobe pin to output a sampled data signal.

Hereinafter, a case in which the memory device 200 operates in the training mode will be described.

According to the inventive concepts, while the memory device 200 operates in the training mode, a plurality of input circuits may correct a voltage offset and a delay offset of a write path included in each of the plurality of input circuits without feedback from the memory controller 11, which will be described in detail with reference to FIG. 4.

Figure 4:
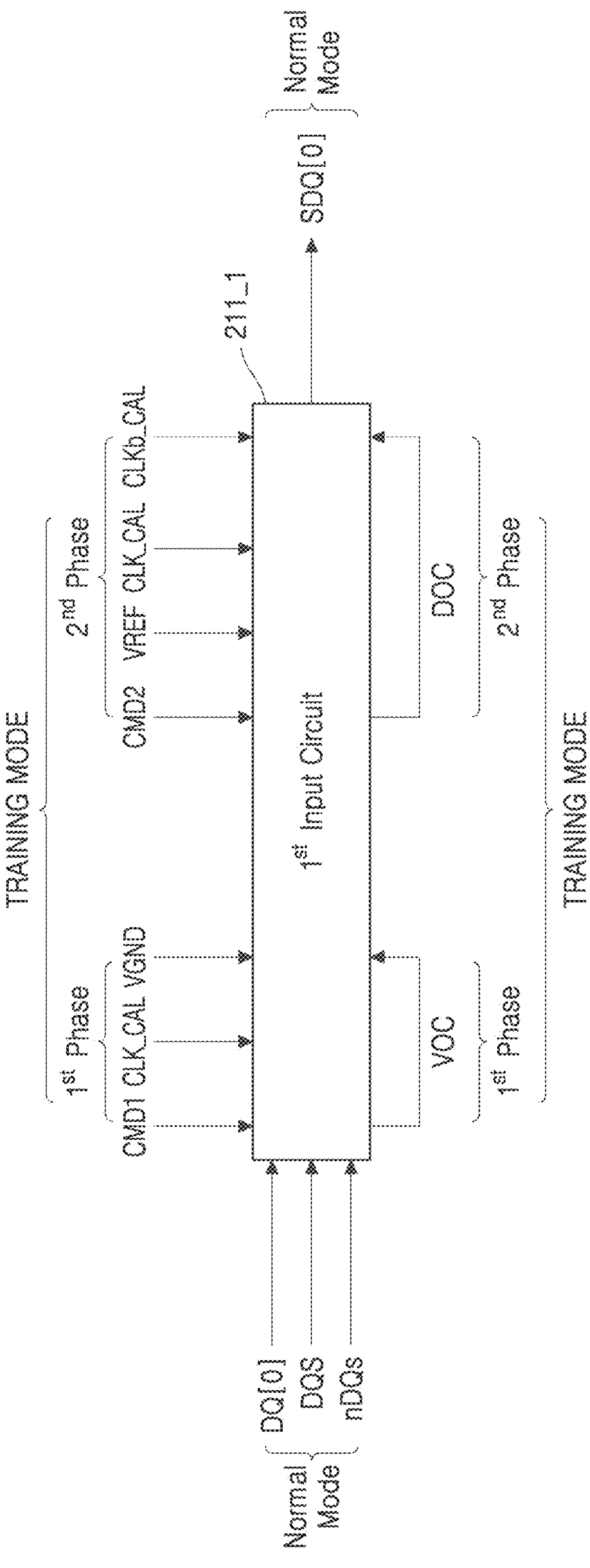
FIG. 4 is a block diagram illustrating an example of an input circuit illustrated in FIG. 3.

FIG. 4 is a block diagram illustrating an example of an input circuit illustrated in FIG. 3. The plurality of input circuits described in FIG. 3 may include the same configuration and may perform the same operation. Accordingly, hereinafter, a configuration and operation of the first input circuit 211_1 illustrated in FIG. 4 will be described. In addition, the first input circuit 211_1 of FIG. 4 will be referred to as an input circuit 211_1.

According to the inventive concepts, while the memory device 200 operates in the training mode, the input circuit 2111 may correct a voltage offset and a delay offset of a write path included in the input circuit 211_1 without feedback from the memory controller 11.

According to some example embodiments, when the memory system 10 operates in the training mode, in the first period 1st phase, the input circuit 211_1 may correct the voltage offset of the write path included in the input circuit 211_1. Referring to FIG. 4, the input circuit 2111 may feedback a voltage offset correction signal VOC based on a ground voltage VGND in synchronization with the first calibration clock signal CLK_CAL in response to a first command CMD1, which will be described in detail with reference to FIGS. 5, 6A, and 6B.

Here, the first period 1st phase may be a period in which the memory device 200 performs ZQ calibration among periods in which the memory device 200 performs a series of training operations.

That is, while the memory device 200 performs ZQ calibration, the input circuit 211_1 may independently correct the voltage offset of the write path included in the input circuit 211_1 in parallel. Accordingly, training operation time of the memory device 200 may not be further increased. Therefore, the improved devices and methods overcome the deficiencies of the conventional devices and methods of memory device usage, particularly related to chip interface training, while reducing resource consumption (e.g., processing capability, power, bandwidth), improving data accuracy, and resource allocation (e.g., latency).

According to some example embodiments, when the memory system 10 operates in the training mode, in the second period 2nd phase, the input circuit 2111 may correct the delay offset of the write path included in the input circuit 211_1. Referring to FIG. 4, the input circuit 2111 may feedback a delay offset correction signal DOC based on the first calibration clock signal CLK_CAL, the second calibration clock signal CLKb_CAL, and the reference voltage VREF in synchronization with the first calibration clock signal CLK_CAL in response to a second command CMD2, which will be described in detail with reference to FIGS. 5, 7A, and 7B.

Here, the second period 2nd phase may be a period in which the memory device 200 performs DCC training among periods in which the memory device 200 performs a series of training operations.

That is, while the memory device 200 performs DCC training, the input circuit 211_1 may independently correct the delay offset of the write path included in the input circuit 211_1 in parallel. Accordingly, training operation time of the memory device 200 may not be further increased.

Figure 5:
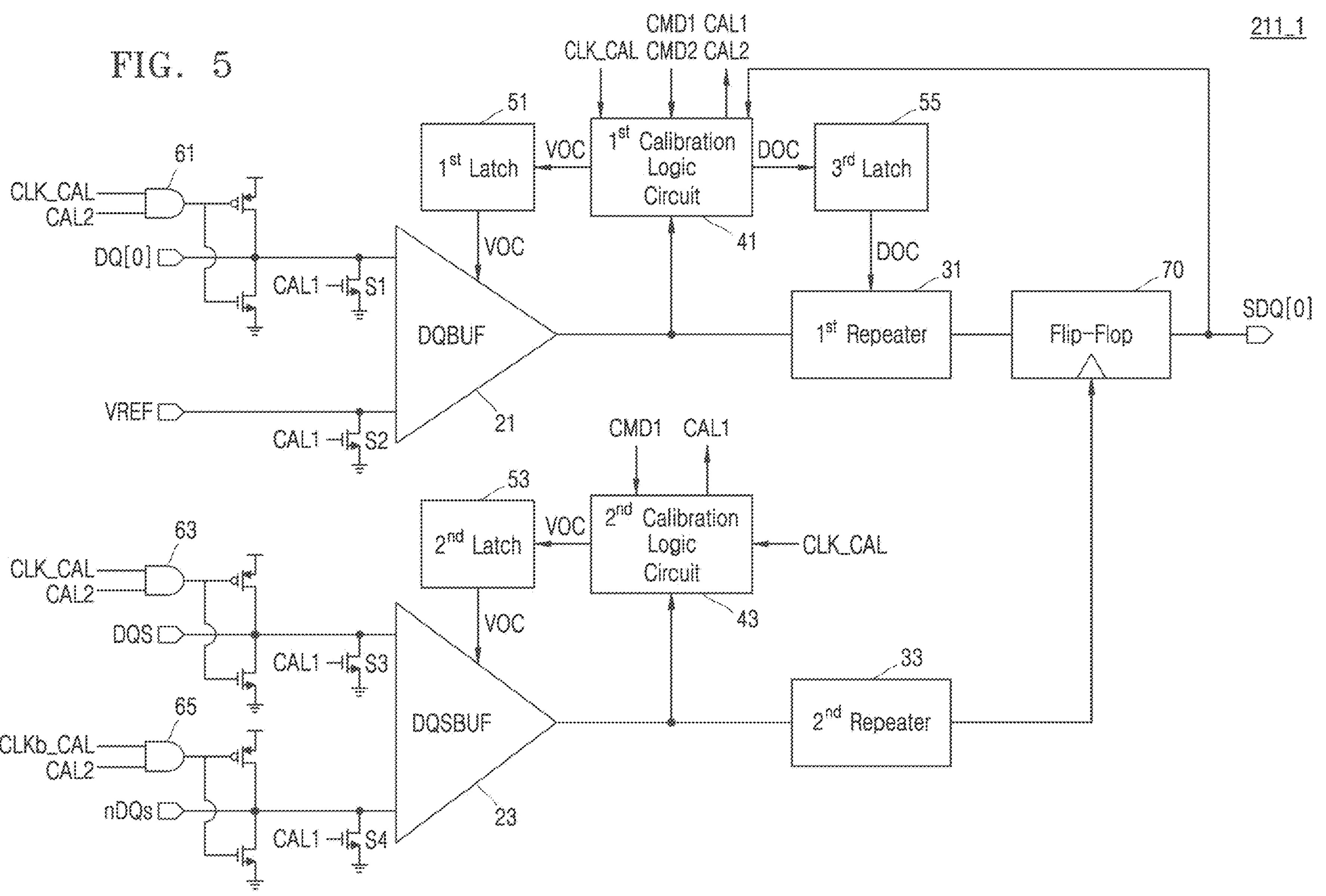
FIG. 5 is a block diagram illustrating an example of the input circuit illustrated in FIG. 4.

FIG. 5 is a block diagram illustrating an example of the input circuit 211_1 illustrated in FIG. 4. FIGS. 6A to 7B are diagrams for explaining an example of an operating method of the input circuit 211_1 illustrated in FIG. 4.

Referring to FIG. 5, the input circuit 211_1 may include a first input buffer 21, a second input buffer 23, a first repeater 31, a first calibration logic circuit 41, a second calibration logic circuit 43, first to third latches 51, 53, and 55, AND logic circuits 61, 63, and 65, a flip-flop 70, and switches S1 to S4. According to some example embodiments, the input circuit 2111 may further include a second repeater 33 connecting an output terminal of the second input buffer 23 to a clock signal receiving terminal of the flip-flop 70. In some cases, the second repeater 33 may be omitted.

According to some example embodiments, the input circuit 211_1 may include the first input buffer 21 connected to a corresponding data pin, the second input buffer 23 connected to a data strobe pin, and the first repeater 31 delaying an output signal of the first input buffer 21. Here, an input terminal of the first repeater 31 may be connected to an output terminal of the first input buffer 21.

In addition, the input circuit 211_1 may further include the flip-flop 70, and an input terminal of the flip-flop 70 may be connected to an output terminal of the first repeater 31. In addition, the output terminal of the second input buffer 23 may be connected to the clock signal receiving terminal of the flip-flop 70.

Here, the flip-flop 70 may perform an operation as a sampler when the memory system 10 operates in the normal mode, and may perform an operation as a phase detector when the memory system 10 operates in the training mode.

Referring to FIG. 5, the first input buffer 21 may include a first input terminal connected to a data pin receiving the first data signal DQ[0] and a second input terminal connected to a reference voltage pin receiving the reference voltage VREF. The second input buffer 23 may include a first input terminal connected to a first data strobe pin receiving the first data strobe signal DQS and a second input terminal connected to a second data strobe pin receiving the second data strobe signal nDQS.

In addition, the first calibration logic circuit 41 may be connected between the output terminal of the first input buffer 21 and a control terminal of the first input buffer 21. The first calibration logic circuit 41 may output the voltage offset correction signal VOC based on the output signal of the first input buffer 21 in synchronization with the first calibration clock signal CLK_CAL in response to the first command CMD1. The first calibration logic circuit 41 may provide the voltage offset correction signal VOC to the first latch 51. Here, the voltage offset correction signal VOC may represent a digital code representing a voltage offset correction value. The first latch 51 may be connected to the control terminal of the first input buffer 21. The first latch 51 may store the voltage offset correction value, and may provide the voltage offset correction signal VOC to the first input buffer 21. In addition, the first calibration logic circuit 41 may output a first calibration signal CAL1 in synchronization with the first calibration clock signal CLK_CAL in response to the first command CMD1. The first calibration logic circuit 41 may provide the first calibration signal CAL1 to the switches S1 to S4.

Here, the first command CMD1 may be a signal representing that a ZQ calibration operation of the memory device 200 has started.

In addition, the second calibration logic circuit 43 may be connected between the output terminal of the second input buffer 23 and a control terminal of the second input buffer 23. The second calibration logic circuit 43 may output the voltage offset correction signal VOC based on an output signal of the second input buffer 23 in synchronization with the first calibration clock signal CLK_CAL in response to the first command CMD1. The second calibration logic circuit 43 may provide the voltage offset correction signal VOC to the second latch 53. Here, the voltage offset correction signal VOC may represent a digital code representing a voltage offset correction value. The second latch 53 may be connected to the control terminal of the second input buffer 23. The second latch 53 may store the voltage offset correction value, and may provide the voltage offset correction signal VOC to the second input buffer 23. In addition, the second calibration logic circuit 43 may output the first calibration signal CAL1 in synchronization with the first calibration clock signal CLK_CAL in response to the first command CMD1. The second calibration logic circuit 43 may provide the first calibration signal CAL1 to the switches S1 to S4.

In some example embodiments, the first calibration logic circuit 41 and the second calibration logic circuit 43 may be implemented as one calibration logic circuit.

In addition, one switch may be connected to each of the first and second input terminals of the first input buffer 21 and the first and second input terminals of the second input buffer 23. The switches S1 to S4 may be connected to a ground voltage pin. The switches S1 to S4 are turned on in response to the first calibration signal CAL1 so that the ground voltage VGND may be provided to the first input buffer 21 and the second input buffer 23.

In addition, the first calibration logic circuit 41 may be connected between an output terminal of the flip-flop 70 and a control terminal of the first repeater 31. The first calibration logic circuit 41 may output the delay offset correction signal DOC based on an output signal of the flip-flop 70 in synchronization with the first calibration clock signal CLK_CAL in response to the second command CMD2. The first calibration logic circuit 41 may provide the delay offset correction signal DOC to the third latch 55. Here, the delay offset correction signal DOC may represent a digital code representing a delay offset correction value. The third latch 55 may be connected to the control terminal of the first repeater 31. The third latch 55 may store the delay offset correction value, and may provide the delay offset correction signal DOC to the first repeater 31. In addition, the first calibration logic circuit 41 may output a second calibration signal CAL2 in synchronization with the first calibration clock signal CLK_CAL in response to the second command CMD2. The first calibration logic circuit 41 may provide the second calibration signal CAL2 to the AND logic circuits 61, 63, and 65.

Here, the second command CMD2 may be a signal representing that a DCC training operation of the memory device 200 has started.

In addition, the AND logic circuit 61 may be connected to the first input terminal of the first input buffer 21. The AND logic circuit 61 may receive the first calibration clock signal CLK_CAL and the second calibration signal CAL2 as input values. In addition, in some example embodiments, referring to FIG. 5, an inverter circuit may be connected between the first input terminal of the first input buffer 21 and the AND logic circuit 61. The AND logic circuit 61 may provide the inverted first calibration clock signal CLK_CAL to the first input buffer 21 in response to the second calibration signal CAL2. Likewise, the AND logic circuit 63 may provide the inverted first calibration clock signal CLK_CAL to the second input buffer 23 in response to the second calibration signal CAL2, and the AND logic circuit 65 may provide the inverted second calibration clock signal CLKb_CAL to the second input buffer 23 in response to the second calibration signal CAL2.

According to some example embodiments, the input circuit 211_1 may include a first loop correcting a voltage offset of each of the first input buffer 21 and the second input buffer 23 and a second loop correcting a delay offset of the first repeater 31.

First, a configuration and operation of the first loop will be described with reference to FIGS. 6A and 6B.

Figure 6A:
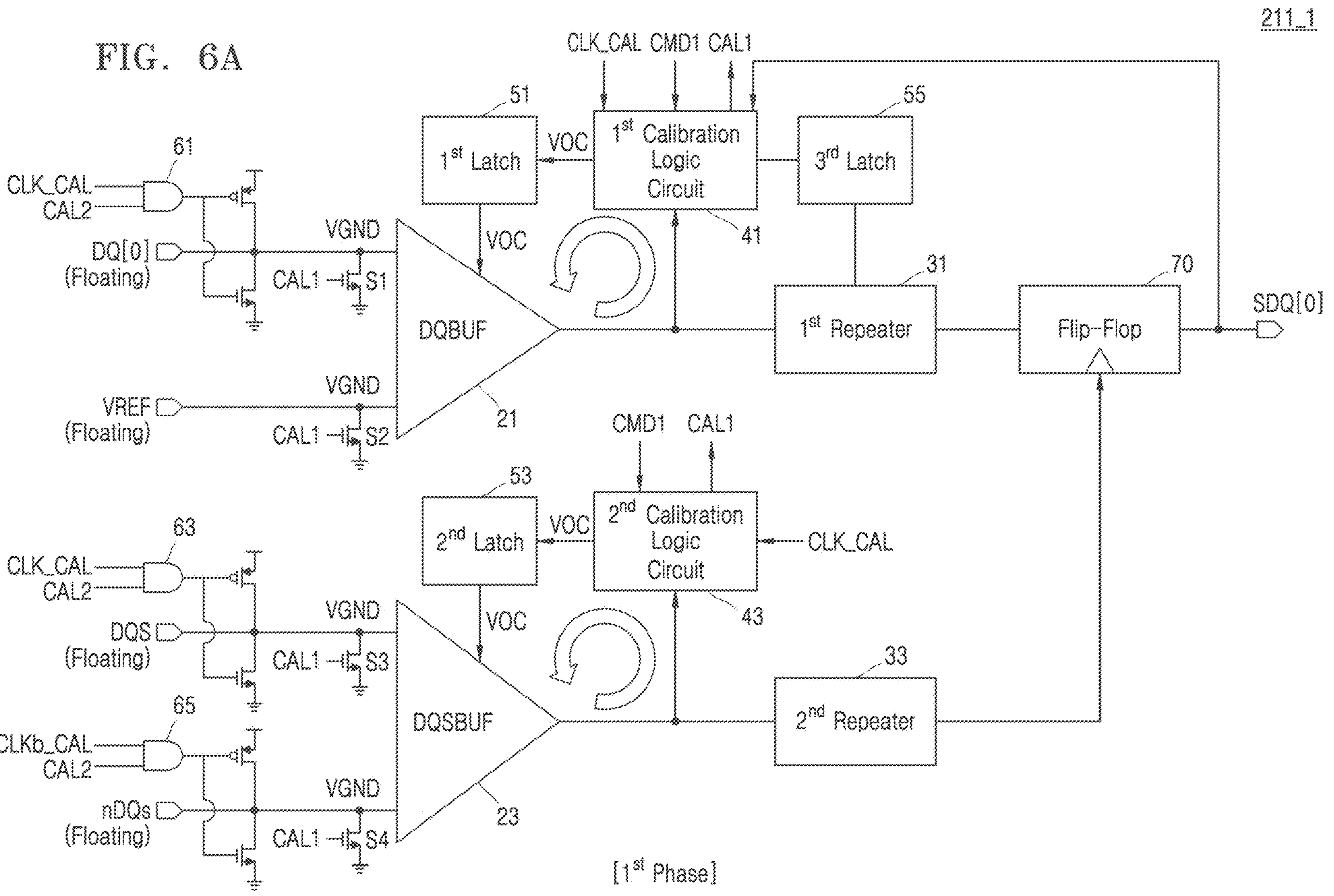
FIGS. 6A to 7B are diagrams for explaining an example of an operating method of the input circuit illustrated in FIG. 4.

Referring to FIG. 6A, the first loop may include a 1-1 loop for the first input buffer 21 and a 1-2 loop for the second input buffer 23.

The 1-1 loop may include the first calibration logic circuit 41 and the first latch 51 connected between the output terminal of the first input buffer 21 and the control terminal of the first input buffer 21. Here, the first calibration logic circuit 41 may be connected to the output terminal of the first input buffer 21, the first latch 51 may be connected to the control terminal of the first input buffer 21, and the first calibration logic circuit 41 and the first latch 51 may be directly connected to each other.

The 1-2 loop may include the second calibration logic circuit 43 and the second latch 53 connected between the output terminal of the second input buffer 23 and the control terminal of the second input buffer 23. Here, the second calibration logic circuit 43 may be connected to the output terminal of the second input buffer 23, the second latch 53 may be connected to the control terminal of the second input buffer 23, and the second calibration logic circuit 43 and the second latch 53 may be directly connected to each other.

When the memory system 10 operates in the training mode, the input circuit 211_1 may correct the voltage offset of each of the first input buffer 21 and the second input buffer 23 through the first loop in the first period 1st phase.

First, the first calibration logic circuit 41 and the second calibration logic circuit 43 may receive the first command CM1 and may output the first calibration signal CAL1. Here, the first command CMD1 may be a signal representing that a ZQ calibration operation of the memory device 200 has started. In addition, the input circuit 2111 may float the reference voltage pin, the corresponding data pin, and the data strobe pins.

Thereafter, the switches S1 to S4 may be turned on in response to the first calibration signal CAL1. Accordingly, a voltage at the same voltage level may be applied to the first input terminal and the second input terminal of the first input buffer 21. In addition, a voltage at the same voltage level may be applied to the first input terminal and the second input terminal of the second input buffer 23. For example, the same voltage level may be a ground voltage level.

Thereafter, the first calibration logic circuit 41 may receive the output signal of the first input buffer 21 as an input value, and may determine polarity of the voltage offset of the first input buffer based on the output signal of the first input buffer 21. In addition, the second calibration logic circuit 43 may receive the output signal of the second input buffer 23 as an input value, and may determine polarity of the voltage offset of the first input buffer based on the output signal of the second input buffer 23. Here, the output signals of the first input buffer 21 and the second input buffer 23 may be signals representing voltage offset values of the corresponding input buffers.

Thereafter, the first calibration logic circuit 41 may provide the first latch 51 with the voltage offset correction signal VOC for correcting the voltage offset of the first input buffer 21 in a direction opposite to the determined polarity. In addition, the second calibration logic circuit 43 may provide the second latch 53 with the voltage offset correction signal VOC for correcting the voltage offset of the second input buffer 23 in a direction opposite to the determined polarity.

Thereafter, the first latch 51 may store the voltage offset correction value, and may provide the voltage offset correction signal VOC to the first input buffer 21. In addition, the second latch 53 may store the voltage offset correction value, and may provide the voltage offset correction signal VOC to the second input buffer 23.

The above-described processes may be performed in synchronization with the first calibration clock signal CLK_CAL.

That is, the input circuit 2111 may be configured to determine the polarities of the voltage offsets of the first input buffer 21 and the second input buffer 23 based on the output signals of the first input buffer 21 and the second input buffer 23 output by applying voltages at the same voltage level to the first input terminal and the second input terminal of each of the first input buffer 21 and the second input buffer 23. In addition, the input circuit 211_1 may be configured to correct the voltage offsets of the first input buffer 21 and the second input buffer 23 in a direction opposite to the determined polarity.

Figure 6B:
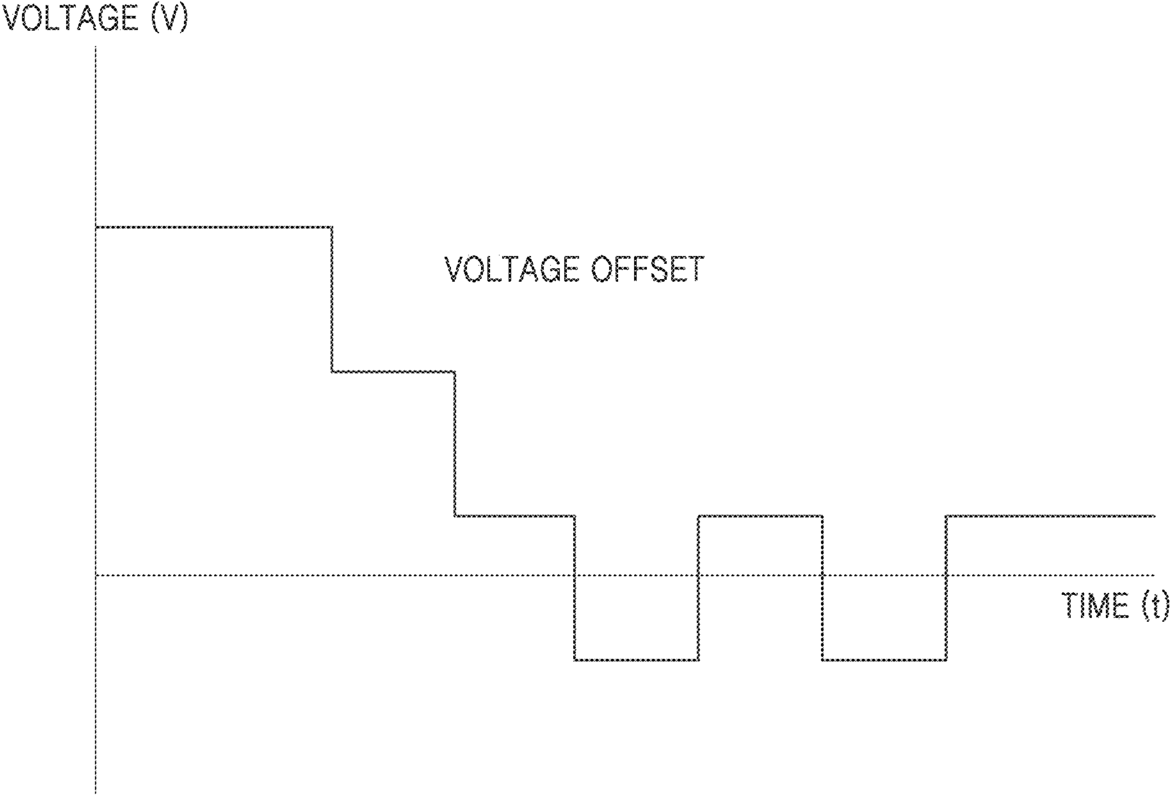

FIG. 6B is a graph illustrating a voltage offset correction operation according to the first loop described in FIG. 6A.

The input circuit 211_1 may apply the same voltage (for example, the ground voltage) to the input terminals of the first input buffer 21 and the second input buffer 23, may determine the polarities of the output terminals of the first input buffer 21 and the second input buffer 23, and may control the voltage offsets of the first input buffer 21 and the second input buffer 23 in a direction opposite to the voltage offset.

Referring to FIG. 6B, because the initially determined polarity is positive (+), it may be noted that the input circuit 211_1 controls the voltage offset in a negative (−) direction.

The input circuit 211_1 may repeat the above-described process until a toggling pattern appears in the output signals of the first input buffer 21 and the second input buffer 23. When the toggling pattern appears in the output signals, the input circuit 2111 may lock the delay offset of each of the first input buffer 21 and the second input buffer 23.

Thereafter, a configuration and operation of the second loop will be described with reference to FIGS. 7A and 7B.

The second loop may include the first calibration logic circuit 41 and the third latch 55 connected between the output terminal of the flip-flop 70 and the control terminal of the first repeater 31. Here, the first calibration logic circuit 41 may be connected to the output terminal of the flip-flop 70, the third latch 55 may be connected to the control terminal of the first repeater 31, and the first calibration logic circuit 41 and the third latch 55 may be directly connected to each other. In addition, the input terminal of the flip-flop 70 may be connected to the output terminal of the first repeater 31, and the clock signal receiving terminal of the flip-flop 70 may be connected to the output terminal of the second input buffer 23.

When the memory system 10 operates in the training mode, the input circuit 211_1 may correct the delay offset of the first repeater 31 through the second loop in the second period 2nd phase.

First, the first calibration logic circuit 41 may receive the second command CMD2 and may output the second calibration signal CAL2. Here, the second command CMD2 may be a signal representing that a DCC training operation of the memory device 200 has started. In addition, the input circuit 211_1 may float the corresponding data pin, and the data strobe pins.

Thereafter, the AND logic circuit 61 may provide the inverted first calibration clock signal CLK_CAL to the first input buffer 21 in response to the second calibration signal CAL2. Likewise, the AND logic circuit 63 may provide the inverted first calibration clock signal CLK_CAL to the second input buffer 23 in response to the second calibration signal CAL2, and the AND logic circuit 65 may provide the inverted second calibration clock signal CLKb_CAL to the second input buffer 23 in response to the second calibration signal CAL2. Accordingly, toggle pattern signals of the same phase may be applied to the first input buffer 21 and the second input buffer 23.

Thereafter, the first calibration logic circuit 41 may receive the output signal of the flip-flop 70 as an input value, and may monitor the output signal of the flip-flop 70.

Thereafter, the first calibration logic circuit 41 may provide the delay offset correction signal DOC for correcting the delay offset of the first repeater 31 to the third latch 55 based on the monitoring result.

Thereafter, the third latch 55 may store the delay offset correction value, and may provide the delay offset correction signal DOC to the first repeater 31.

The above-described processes may be performed in synchronization with the first calibration clock signal CLK_CAL.

That is, the input circuit 2111 may be configured to monitor the output signal of the flip-flop 70 output by applying the toggle pattern signals of the same phase to the first input buffer 21 and the second input buffer 23, and to correct the delay offset of the first repeater 31 based on the monitoring result.

Figure 7A:
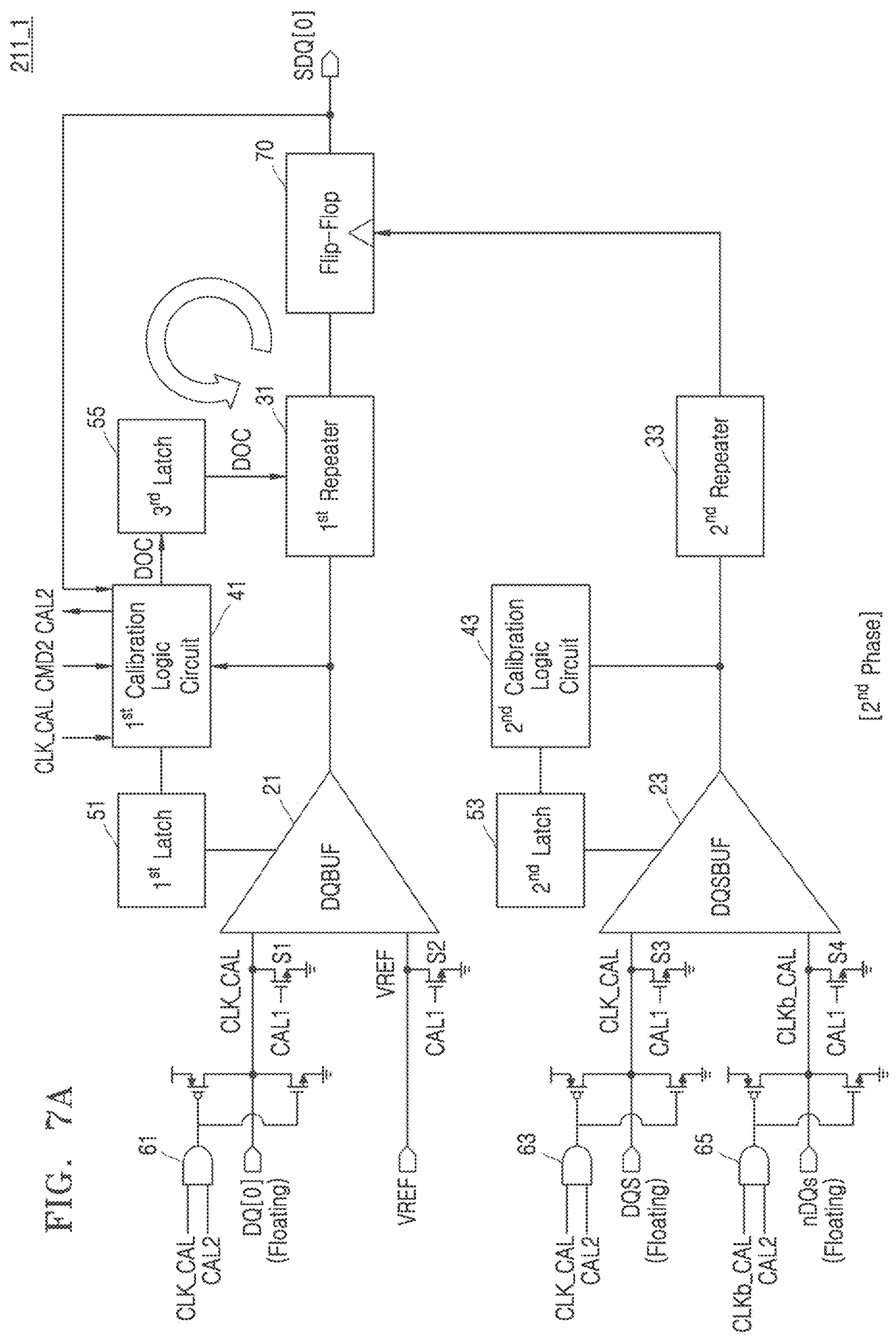
Figure 7B:
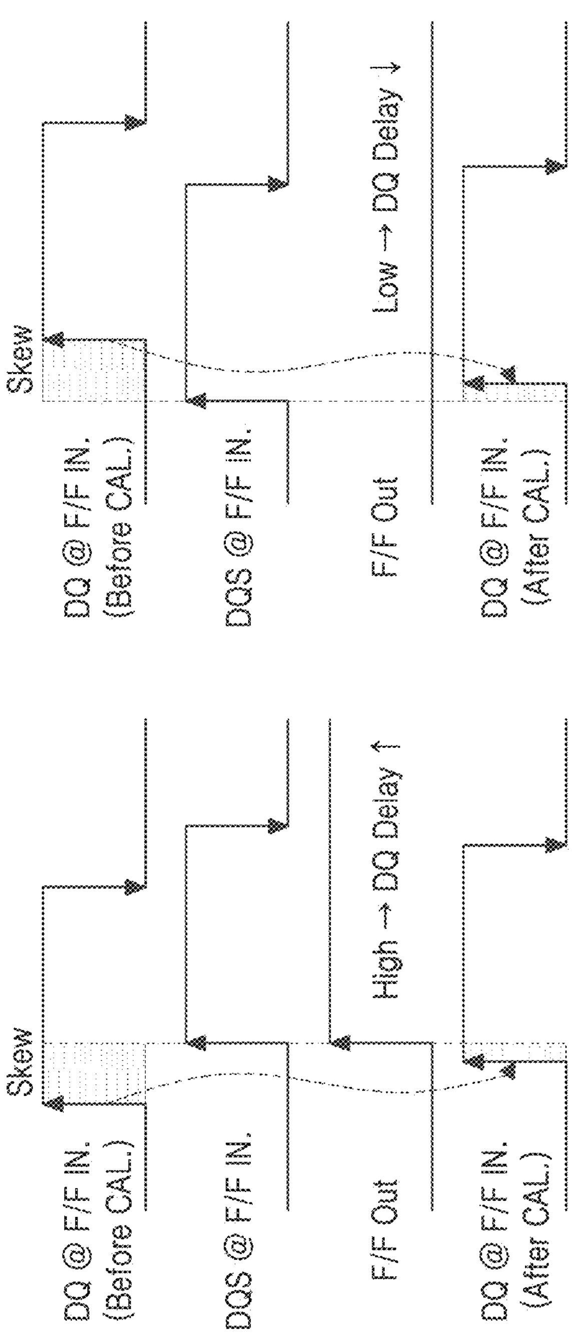

FIG. 7B is a diagram illustrating a delay offset correction operation according to the second loop described in FIG. 7A.

The first calibration logic circuit 41 may receive the output signal of the flip-flop 70 as an input value, and may monitor the output signal of the flip-flop 70. The first calibration logic circuit 41 may provide the delay offset correction signal DOC for correcting the delay offset of the first repeater 31 to the third latch 55 based on the monitoring result.

In order to minimize or reduce skew, timings at which rising edges (or falling edges) of the data signal and the data strobe signal occur must be controlled to be the same.

Referring to FIG. 7B, when a rising edge of the output signal of the first repeater 31 is faster than a rising edge of the output signal of the second input buffer 23, the input circuit 211_1 may increase a delay offset value of the first repeater 31 to further delay the output signal of the first repeater 31. To the contrary, when the rising edge of the output signal of the first repeater 31 is slower than the rising edge of the output signal of the second input buffer 23, the input circuit 2111 may reduce the delay offset value of the first repeater 31 to delay the output signal of the first repeater 31 less.

In some example embodiments, the input circuit 211_1 may be configured to increase the delay offset of the first repeater 31 when a logic value represented by the output signal of the flip-flop 70 is logic high, and to reduce the delay offset of the first repeater 31 when the logic value represented by the output signal of the flip-flop 70 is logic low. Here, the flip-flop 70 may operate as a phase detector.

The input circuit 211_1 may repeat the above-described process until a toggling pattern appears in the output signal of the flip-flop 70. When the toggling pattern appears in the output signal, the input circuit 2111 may lock the delay offset of the first repeater 31.

According to the inventive concepts, the input circuit 211_1 includes the first loop correcting the voltage offset of each of the first input buffer 21 and the second input buffer 23 and the second loop correcting the delay offset of the first repeater 31 so that, while the memory device 200 operates in the training mode, the input circuit 211_1 in the memory device 200 may correct the voltage offset and the delay offset of the write path included in the input circuit 211_1 without feedback from the memory controller 11.

In addition, while the memory device 200 performs the ZQ calibration, the input circuit 211_1 included in the memory device 200 may independently correct the voltage offset of the write path included in the input circuit 211_1. In addition, while the memory device 200 performs the DCC training, the input circuit 211_1 included in the memory device 200 may independently correct the voltage offset of the write path included in the input circuit 211_1. Accordingly, training operation time of the memory device 200 may not be further increased.

Figure 8:
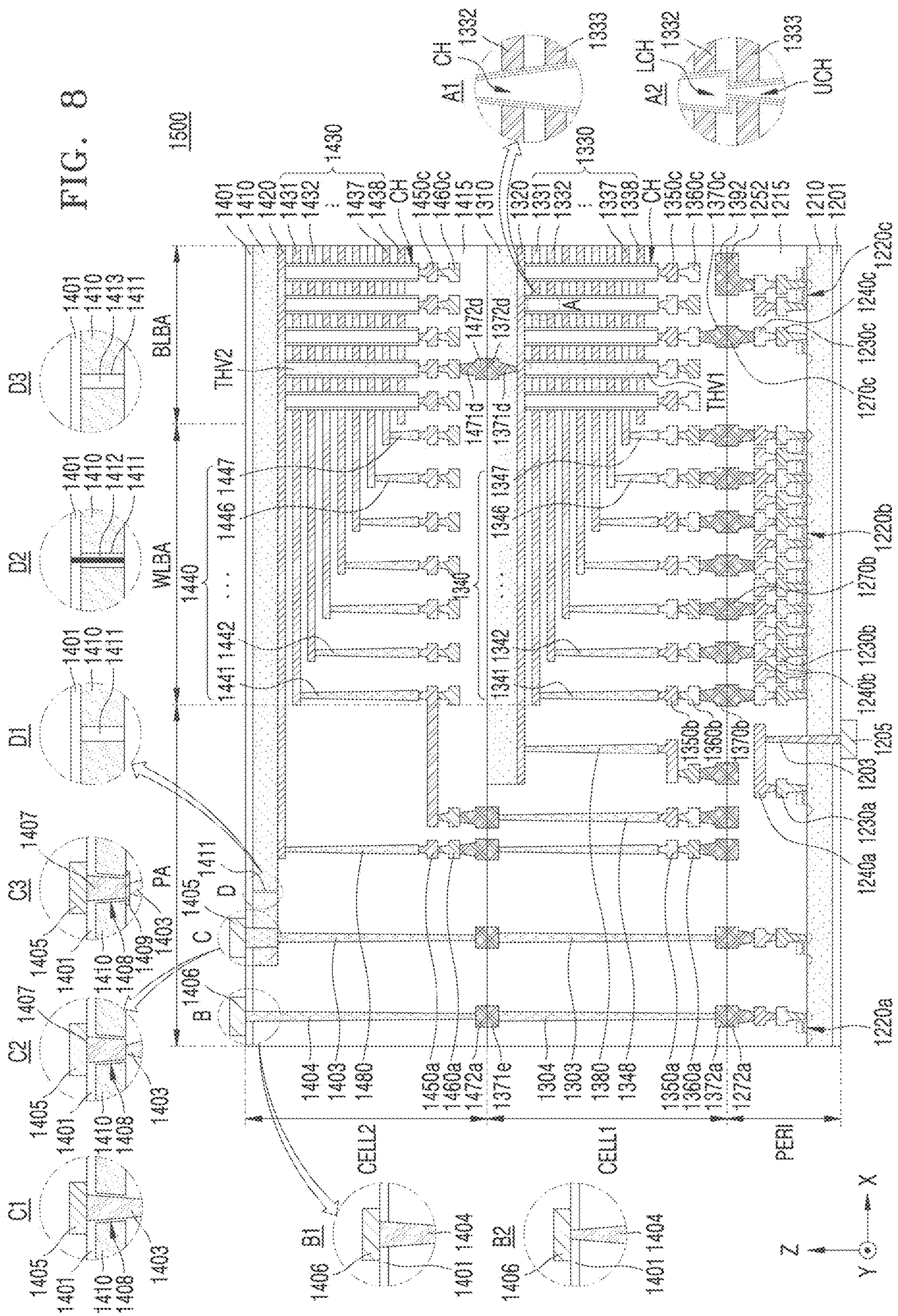
FIG. 8 is a cross-sectional view of a memory device having a BVNAND structure according to some example embodiments.

FIG. 8 is a cross-sectional view of a memory device 1500 having a BVNAND structure according to some example embodiments.

Referring to FIG. 8, the memory device 1500 may have a chip-to-chip (C2C) structure. Here, the C2C structure may refer to manufacturing at least one upper chip including a cell region CELL and a lower chip including a peripheral circuit region PERI, and then connecting the at least one upper chip to the lower chip by the bonding method. For example, the bonding method may refer to a method of electrically or physically connecting a bonding metal pattern formed on the uppermost metal layer of the upper chip and a bonding metal pattern formed on the uppermost metal layer of the lower chip to each other. For example, when the bonding metal patterns include copper (Cu), the bonding method may be a Cu—Cu bonding method. As another example, the bonding metal patterns may include aluminum (Al) or tungsten (W).

The memory device 1500 may include at least one upper chip including a cell region. For example, as illustrated in FIG. 8, the memory device 1500 may be implemented to include two upper chips, but the inventive concepts are not limited thereto. The number of upper chips is not limited thereto. When the memory device 1500 includes two upper chips, the memory device 1500 may be manufactured by manufacturing a first upper chip including a first cell region CELL1, a second upper chip including a second cell region CELL2, and a lower chip including a peripheral circuit region PERI, respectively, and then connecting the first upper chip, the second upper chip, and the lower chip to one another by a bonding method. The first upper chip may be inverted and connected to the lower chip by the bonding method, and the second upper chip may also be inverted and connected to the first upper chip by the bonding method. In the following description, upper and lower portions of the first and second upper chips are defined based on the time before the first and second upper chips are inverted. That is, in FIG. 8, the upper portion of the lower chip refers to an upper portion defined based on a +Z axis direction, and the upper portion of each of the first and second upper chips refers to an upper portion defined based on a −Z axis direction, but the inventive concepts are not limited thereto. Either one of the first upper chip and the second upper chip may be inverted and connected by the bonding method.

Each of the peripheral circuit region PERI and the first and second cell regions CELL1 and CELL2 of the memory device 1500 may include an external pad bonding region PA, a word line bonding region WLBA, and a bit line bonding region BLBA.

The peripheral circuit region PERI may include a first substrate 1210 and a plurality of circuit elements 1220*a*, 1220*b*, and 1220*c* formed on the first substrate 1210. An interlayer insulating layer 1215 including one or more insulating layers may be provided on the plurality of circuit elements 1220*a*, 1220*b*, and 1220*c*, and a plurality of metal wires connecting the plurality of circuit elements 1220*a*, 1220*b*, and 1220*c* may be provided in the interlayer insulating layer 1215. For example, the plurality of metal wires may include first metal wires 1230*a*, 1230*b*, and 1230*c* connected to the plurality of circuit elements 1220*a*, 1220*b*, and 1220*c*, respectively, and second metal wires 1240*a*, 1240*b*, and 1240*c* formed on the first metal wires 1230*a*, 1230*b*, and 1230*c*. The plurality of metal wires may include at least one of various conductive materials. For example, the first metal wires 1230*a*, 1230*b*, and 1230*c* may include W having relatively high electrical resistivity, and the second metal wires 1240*a*, 1240*b*, and 1240*c* may include Cu having relatively low electrical resistivity.

In the current specification, only the first metal wires 1230*a*, 1230*b*, and 1230*c* and the second metal wires 1240*a*, 1240*b*, and 1240*c* are illustrated and described, but the inventive concepts are not limited thereto, and one or more additional metal wires may be further formed on the second metal wires 1240*a*, 1240*b*, and 1240*c*. In this case, the second metal wires 1240*a*, 1240*b*, and 1240*c* may include Al. In addition, at least some of the additional metal wires formed on the second metal wires 1240*a*, 1240*b*, and 1240*c* may include Cu having lower electrical resistivity than Al of the second metal wires 1240*a*, 1240*b*, and 1240*c*.

The interlayer insulating layer 1215 is arranged on the first substrate 1210 and may include an insulating material such as silicon oxide or silicon nitride.

Each of the first and second cell regions CELL1 and CELL2 may include at least one memory block. The first cell region CELL1 may include a second substrate 1310 and a common source line 1320. On the second substrate 1310, a plurality of upper and lower word lines 1331 to 1338 may be stacked in a direction (Z axis direction) perpendicular to a top surface of the second substrate 1310. String selection lines and a ground selection line may be arranged on and under the plurality of upper and lower word lines 1331 to 1338, and the plurality of upper and lower word lines 1331 to 1338 may be arranged between the string selection lines and the ground selection line. Likewise, the second cell region CELL2 includes a third substrate 1410 and a common source line 1420, and a plurality of word lines 1431 to 1438 may be stacked in a direction (Z axis direction) perpendicular to a top surface of the third substrate 1410. The second substrate 1310 and the third substrate 1410 may include various materials and may be, for example, a silicon substrate, a silicon-germanium substrate, a germanium substrate, or a substrate having a single crystal epitaxial layer grown on a monocrystalline silicon substrate. A plurality of channel structures CH may be formed in each of the first and second cell regions CELL1 and CELL2.

In some example embodiments, as illustrated in A1, the plurality of channel structures CH may be provided in a bit line bonding region BLBA and may extend in a direction perpendicular to the top surface of the second substrate 1310 through the plurality of upper and lower word lines 1331 to 1338, the string selection lines, and the ground selection line. The channel structure CH may include a data storage layer, a channel layer, and a buried insulating layer. The channel layer may be electrically connected to first metal wires 1350*c* and second metal wires 1360*c* in the bit line bonding region BLBA. For example, the second metal wires 1360*c* may be bit lines, and may be connected to the plurality of channel structures CH through the first metal wires 1350*c*. The bit line may extend in the first direction (Y axis direction) parallel to the top surface of the second substrate 1310.

In some example embodiments, as illustrated in A2, the channel structure CH may include a lower channel LCH and an upper channel UCH connected to each other. For example, the channel structure CH may be formed through a process for the lower channel LCH and a process for the upper channel UCH. The lower channel LCH may extend in a direction perpendicular to the top surface of the second substrate 1310 through the common source line 1320 and the lower word lines 1331 and 1332. The lower channel LCH may include a data storage layer, a channel layer, and a buried insulating layer, and may be connected to the upper channel UCH. The upper channel UCH may pass through the upper word lines 1333 to 1338. The upper channel UCH may include a data storage layer, a channel layer, and a buried insulating layer, and the channel layer of the upper channel UCH may be electrically connected to the first metal wire 1350*c* and the second metal wire 1360*c*. As a length of a channel increases, it may become difficult to form a channel having a constant width due to process reasons. The memory device 1500 according to some example embodiments may have a channel with improved width uniformity through the lower channel LCH and the upper channel UCH formed through sequential processes.

As illustrated in A2, when the channel structure CH is formed to include the lower channel LCH and the upper channel UCH, word lines near a boundary between the lower channel LCH and the upper channel UCH may be dummy word lines. For example, the lower word lines 1332 and 1333 forming the boundary between the lower channel LCH and the upper channel UCH may be dummy word lines. In this case, data may not be stored in memory cells connected to the dummy word lines. Alternatively, the number of pages corresponding to the memory cells connected to the dummy word lines may be less than the number of pages corresponding to memory cells connected to general word lines. A level of a voltage applied to the dummy word line may be different from a level of the voltage applied to the general word line, and accordingly, influence of a non-uniform channel width between the lower channel LCH and the upper channel UCH on the operation of the memory device may be reduced.

Meanwhile, in A2, the number of lower word lines 1331 and 1332 through which the lower channel LCH passes is illustrated as being less than the number of upper word lines 1333 and 1338 through which the upper channel UCH passes, but the inventive concepts are not limited thereto. The inventive concepts are not limited thereto. As another example, the number of lower word lines through which the lower channel LCH passes may be equal to or greater than the number of upper word lines through which the upper channel UCH passes. In addition, the structure and connection relationship of the channel structure CH arranged in the first cell region CELL1 described above may be equally applied to the channel structure CH arranged in the second cell region CELL2.

In the bit line bonding region BLBA, a first through electrode THV1 may be provided in the first cell region CELL1, and a second through electrode THV2 may be provided in the second cell region CELL2. As illustrated in FIG. 8, the first through electrode THV1 may pass through the common source line 1320 and the plurality of upper and lower word lines 1331 to 1338, but the inventive concepts are not limited thereto. The first through electrode THV1 may further pass through the second substrate 1310. The first through electrode THV1 may include a conductive material. Alternatively, the first through electrode THV1 may include a conductive material surrounded by an insulating material. The second through electrode THV2 may also be provided in the same shape and structure as the first through electrode THV1.

In some example embodiments, the first through electrode THV1 and the second through electrode THV2 may be electrically connected through a first through metal pattern 1372*d* and a second through metal pattern 1472*d*. The first through metal pattern 1372*d* may be formed at a lower end of a first upper chip including the first cell region CELL1, and the second through metal pattern 1472*d* may be formed at an upper end of a second upper chip including the second cell region CELL2. The first through electrode THV1 may be electrically connected to the first metal wire 1350*c* and the second metal wire 1360*c*. A lower via 1371*d* may be formed between the first through electrode THV1 and the first through metal pattern 1372*d*, and an upper via 1471*d* may be formed between the second through electrode THV2 and the second through metal pattern 1472*d*. The first through metal pattern 1372*d* and the second through metal pattern 1472*d* may be connected by a bonding method.

In addition, in the bit line bonding region BLBA, an upper metal pattern 1252 may be formed on the uppermost metal layer of a peripheral circuit region PERI, and an upper metal pattern 1392 of the same shape as the upper metal pattern 1252 may be formed on the uppermost metal layer of the first cell region CELL1. The upper metal pattern 1392 of the first cell region CELL1 and the upper metal pattern 1252 of the peripheral circuit region PERI may be electrically connected to each other by a bonding method. In the bit line bonding region BLBA, the bit line may be electrically connected to a page buffer included in the peripheral circuit region PERI. For example, some of the circuit elements 1220*c* of the peripheral circuit region PERI may provide a page buffer, and the bit lines may be electrically connected to the circuit elements 1220*c* providing the page buffer through upper bonding metals 1370*c* of the first cell region CELL1 and upper bonding metals 1270*c* of the peripheral circuit region PERI.

Subsequently, referring to FIG. 8, in the word line bonding region WLBA, the plurality of upper and lower word lines 1331 to 1338 of the first cell region CELL1 may extend in a second direction (X axis direction) parallel to the top surface of the second substrate 1310, and may be connected to a plurality of cell contact plugs 1341 to 1347. First metal wires 1350*b* and second metal wires 1360*b* may be sequentially connected to the plurality of cell contact plugs 1341 to 1347 connected to the plurality of upper and lower word lines 1331 to 1338. The plurality of cell contact plugs 1341 to 1347 may be connected to the peripheral circuit region PERI through upper bonding metals 1370*b* of the first cell region CELL1 and upper bonding metals 1270*b* of the peripheral circuit region PERI in the word line bonding region WLBA.

The plurality of cell contact plugs 1341 to 1347 may be electrically connected to a row decoder included in the peripheral circuit region PERI. For example, some of the circuit elements 1220*b* of the peripheral circuit region PERI provide the row decoder, and the plurality of cell contact plugs 1341 to 1347 may be electrically connected to the circuit elements 1220*b* providing the row decoder through the upper bonding metals 1370*b* of the first cell region CELL1 and the upper bonding metals 1270*b* of the peripheral circuit region PERI. In some example embodiments, an operating voltage of the circuit elements 1220*b* providing the row decoder may be different from an operating voltage of the circuit elements 1220*c* providing the page buffer. For example, the operating voltage of the circuit elements 1220*c* providing the page buffer may be greater than the operating voltage of the circuit elements 1220*b* providing the row decoder.

Likewise, in the word line bonding region WLBA, the plurality of word lines 1431 to 1438 of the second cell region CELL2 may extend in the second direction (X axis direction) parallel to the top surface of the third substrate 1410, and may be connected to a plurality of cell contact plugs 1441 to 1447. The plurality of cell contact plugs 1441 to 1447 may be connected to the peripheral circuit region PERI through the upper metal pattern of the second cell region CELL2, the lower metal pattern and the upper metal pattern of the first cell region CELL1, and a cell contact plug 1348.

In the word line bonding region WLBA, the upper bonding metals 1370*b* may be formed in the first cell region CELL1, and the upper bonding metals 1270*b* may be formed in the peripheral circuit region PERI. The upper bonding metals 1370*b* of the first cell region CELL1 and the upper bonding metals 1270*b* of the peripheral circuit region PERI may be electrically connected by the bonding method. The upper bonding metal 1370*b* and the upper bonding metal 1270*b* may include Al, Cu, or W.

In the external pad bonding region PA, lower metal patterns 1371*e* may be formed in a lower portion of the first cell region CELL1, and upper metal patterns 1472*a* may be formed in an upper portion of the second cell region CELL2. The lower metal patterns 1371*e* of the first cell region CELL1 and the upper metal patterns 1472*a* of the second cell region CELL2 may be connected by the bonding method in the external pad bonding region PA. Likewise, upper metal patterns 1372*a* may be formed in an upper portion of the first cell region CELL1, and upper metal patterns 1272*a* may be formed in an upper portion of the peripheral circuit region PERT. The upper metal patterns 1372*a* of the first cell region CELL1 and the upper metal patterns 1272*a* of the peripheral circuit region PERI may be connected by the bonding method.

Common source line contact plugs 1380 and 1480 may be arranged in the external pad bonding region PA. The common source line contact plugs 1380 and 1480 may include a conductive material such as a metal, a metal compound, or doped polysilicon. The common source line contact plug 1380 of the first cell region CELL1 may be electrically connected to the common source line 1320, and the common source line contact plug 1480 of the second cell region CELL2 may be electrically connected to the common source line 1420. A first metal wire 1350*a* and a second metal wire 1360*a* may be sequentially stacked on the common source line contact plug 1380 of the first cell region CELL1, and a first metal wire 1450*a* and a second metal wire 1460*a* may be sequentially stacked on the common source line contact plug 1480 of the second cell region CELL2.

First to third input/output pads 1205, 1405, and 1406 may be arranged in the external pad bonding region PA. Referring to FIG. 8, a lower insulating layer 1201 may cover a bottom surface of the first substrate 1210, and the first input/output pad 1205 may be formed on the lower insulating layer 1201. The first input/output pad 1205 may be connected to at least one of the plurality of circuit elements 1220*a* arranged in the peripheral circuit region PERI through a first input/output contact plug 1203, and may be separated from the first substrate 1210 by the lower insulating layer 1201. In addition, a side insulating layer may be arranged between the first input/output contact plug 1203 and the first substrate 1210 to electrically separate the first input/output contact plug 1203 from the first substrate 1210.

An upper insulating layer 1401 covering the top surface of the third substrate 1410 may be formed on the third substrate 1410. The second input/output pad 1405 and/or the third input/output pad 1406 may be arranged on the upper insulating layer 1401. The second input/output pad 1405 may be connected to at least one of the plurality of circuit elements 1220*a* arranged in the peripheral circuit region PERI through second input/output contact plugs 1403 and 1303, and the third input/output pad 1406 may be connected to at least one of the plurality of circuit elements 1220*a* arranged in the peripheral circuit region PERI through third input/output contact plugs 1404 and 1304.

In some example embodiments, the third substrate 1410 may not be arranged in a region in which the input/output contact plug is arranged. For example, as illustrated in B, the third input/output contact plug 1404 may be separated from the third substrate 1410 in a direction parallel to the top surface of the third substrate 1410, and may be connected to the third input/output pad 1406 through an interlayer insulating layer 1415 of the second cell region CELL2. In this case, the third input/output contact plug 1404 may be formed by various processes.

For example, as illustrated in B1, the third input/output contact plug 1404 may extend in a third direction (Z axis direction) and may have a diameter increasing toward the upper insulating layer 1401. That is, while a diameter of the channel structure CH described in A1 may decrease toward the upper insulating layer 1401, the diameter of the third input/output contact plug 1404 may increase toward the upper insulating layer 1401. For example, the third input/output contact plug 1404 may be formed after the second cell region CELL2 and the first cell region CELL1 are combined by the bonding method.

In addition, for example, as illustrated in B2, the third input/output contact plug 1404 may extend in the third direction (Z axis direction) and may have a diameter decreasing toward the upper insulating layer 1401. That is, the diameter of the third input/output contact plug 1404 may decrease toward the upper insulating layer 1401 like the diameter of the channel structure CH. For example, the third input/output contact plug 1404 may be formed together with the plurality of cell contact plugs 1441 to 1447 before the second cell region CELL2 and the first cell region CELL1 are combined by the bonding method.

In another embodiment, the input/output contact plug may be arranged to overlap the third substrate 1410. For example, as illustrated in C, the second input/output contact plug 1403 is formed through the interlayer insulating layer 1415 of the second cell region CELL2 in the third direction (Z axis direction), and may be electrically connected to the second input/output pad 1405 through the third substrate 1410. In this case, a connection structure between the second input/output contact plug 1403 and the second input/output pad 1405 may be implemented in various ways.

For example, as illustrated in C1, an opening 1408 may be formed through the third substrate 1410, and the second input/output contact plug 1403 may be directly connected to the second input/output pad 1405 through the opening 1408 formed in the third substrate 1410. In this case, as illustrated in C1, a diameter of the second input/output contact plug 1403 may increase toward the second input/output pad 1405, but the inventive concepts are not limited thereto. The diameter of the second input/output contact plug 1403 may decrease toward the second input/output pad 1405.

For example, as illustrated in C2, the opening 1408 may be formed through the third substrate 1410, and a contact 1407 may be formed in the opening 1408. One end of the contact 1407 may be connected to the second input/output pad 1405 and the other end of the contact 1407 may be connected to the second input/output contact plug 1403. Accordingly, the second input/output contact plug 1403 may be electrically connected to the second input/output pad 1405 through the contact 1407 in the opening 1408. In this case, as illustrated in C2, a diameter of the contact 1407 may increase toward the second input/output pad 1405 and the diameter of the second input/output contact plug 1403 may decrease toward the second input/output pad 1405. For example, the second input/output contact plug 1403 may be formed together with the plurality of cell contact plugs 1441 to 1447 before the second cell region CELL2 and the first cell region CELL1 are combined by the bonding method, and the contact 1407 may be formed after the second cell region CELL2 and the first cell region CELL1 are combined by the bonding method.

In addition, for example, as illustrated in C3, a stopper 1409 may be further formed on a top surface of the opening 1408 of the third substrate 1410 compared to C2. The stopper 1409 may be a metal wire formed on the same layer as the common source line 1420, but the inventive concepts are not limited thereto. The stopper 1409 may be a metal wire formed in the same layer as at least one of the plurality of word lines 1431 to 1438. The second input/output contact plug 1403 may be electrically connected to the second input/output pad 1405 through the contact 1407 and the stopper 1409.

Meanwhile, like the second and third input/output contact plugs 1403 and 1404 of the second cell region CELL2, the second and third input/output contact plugs 1303 and 1304 of the first cell region CELL1 may each have a diameter decreasing or increasing toward the lower metal patterns 1371*e*.

Meanwhile, according to embodiments, a slit 1411 may be formed in the third substrate 1410. For example, the slit 1411 may be formed at an arbitrary position in the external pad bonding region PA. For example, as illustrated in D, the slit 1411 may be positioned between the second input/output pad 1405 and the plurality of cell contact plugs 1441 to 1447 when viewed in a plan view, but the inventive concepts are not limited thereto. When viewed in a plan view, the slit 1411 may be formed so that the second input/output pad 1405 is positioned between the slit 1411 and the plurality of cell contact plugs 1441 to 1447.

For example, as illustrated in D1, the slit 1411 may be formed through the third substrate 1410. For example, the slit 1411 may be used to prevent or reduce the third substrate 1410 from being finely cracked when forming the opening 1408, but the inventive concepts are not limited thereto. The slit 1411 may be formed to a depth of about or exactly 60% to about or exactly 70% of a thickness of the third substrate 1410.

In addition, for example, as illustrated in D2, a conductive material 1412 may be formed in the slit 1411. The conductive material 1412 may be used, for example, to discharge a leakage current generated while driving circuit elements in the external pad bonding region PA. In this case, the conductive material 1412 may be connected to an external ground line.

In addition, for example, as illustrated in D3, an insulating material 1413 may be formed in the slit 1411. The insulating material 1413 may be formed, for example, to electrically separate the second input/output pad 1405 and the second input/output contact plug 1403 arranged in the external pad bonding region PA from the word line bonding region WLBA. By forming the insulating material 1413 in the slit 1411, it is possible to prevent or reduce a voltage provided through the second input/output pad 1405 from affecting a metal layer arranged on the third substrate 1410 in the word line bonding region WLBA.

Meanwhile, according to embodiments, the first to third input/output pads 1205, 1405, and 1406 may be selectively formed. For example, the memory device 1500 may include only the first input/output pad 1205 arranged on the first substrate 1210, only the second input/output pad 1405 arranged on the third substrate 1410, or only the third input/output pad 1406 arranged on the upper insulating layer 1401.

Meanwhile, according to embodiments, at least one of the second substrate 1310 of the first cell region CELL1 and the third substrate 1410 of the second cell region CELL2 may be used as a sacrificial substrate, and may be completely or partially removed before or after the bonding process. An additional layer may be stacked after the substrate is removed. For example, the second substrate 1310 of the first cell region CELL1 may be removed before or after bonding the peripheral circuit region PERI and the first cell region CELL1, and an insulating layer covering a top surface of the common source line 1320 or a conductive layer for connection may be formed. Similarly, the third substrate 1410 of the second cell region CELL2 may be removed before or after bonding the first cell region CELL1 and the second cell region CELL2, and the upper insulating layer 1401 covering a top surface of the common source line 1420 or a conductive layer for connection may be formed.

Figure 9:
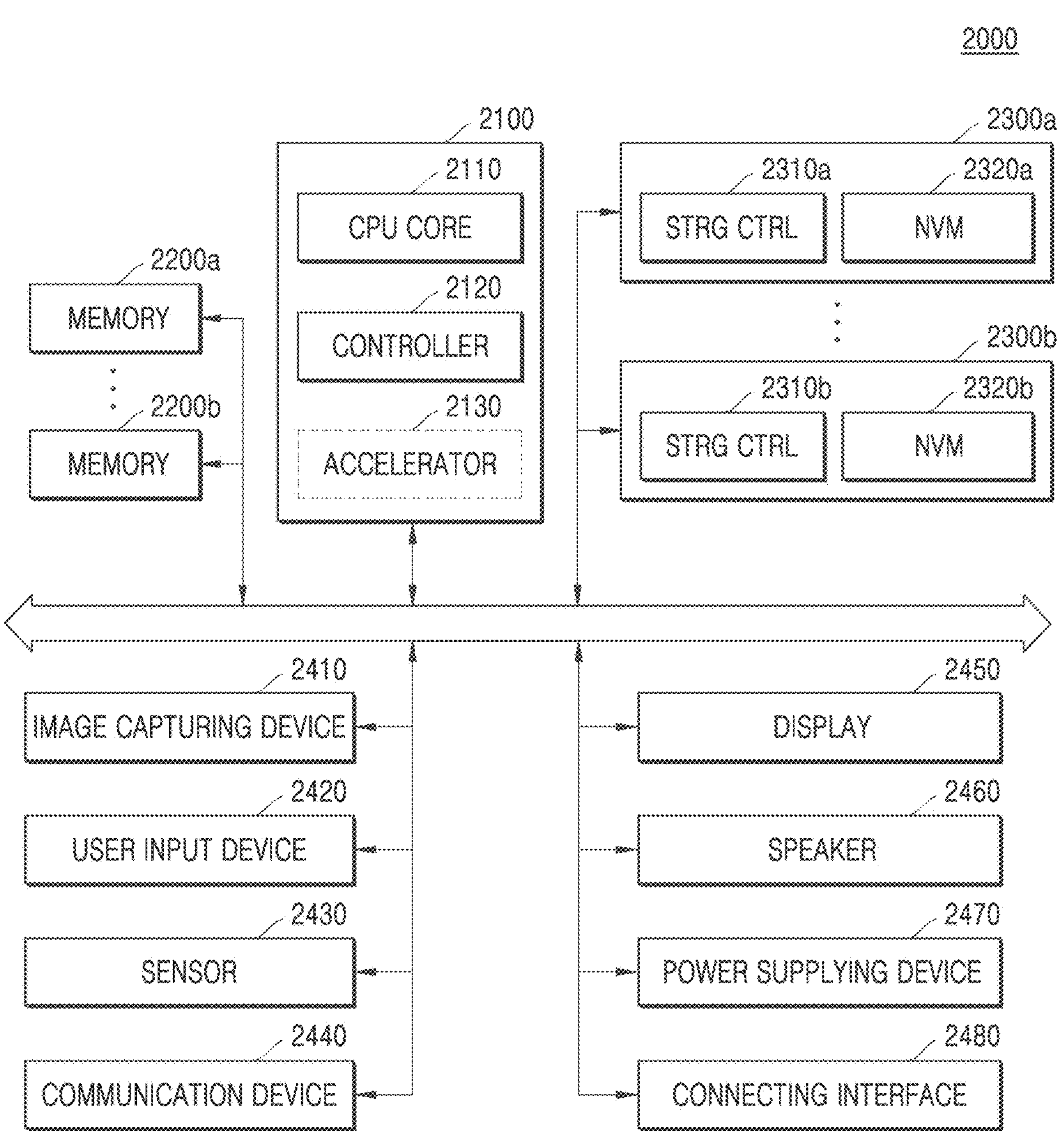
FIG. 9 is a diagram illustrating a system including a storage device according to some example embodiments.

FIG. 9 is a diagram illustrating a system 2000 to which a storage device according to some example embodiments is applied.

Referring to FIG. 9, the system 2000 of FIG. 9 may basically be a mobile system such as a mobile phone, a smart phone, a tablet personal computer (PC), a wearable device, a healthcare device, or an Internet of things (IoT) device. However, the system 2000 of FIG. 9 is not limited to the mobile system, but may be a personal computer, a laptop computer, a server, a media player, or an automotive device such as navigation.

Referring to FIG. 9, the system 2000 may include a main processor 2100, memories 2200*a* and 2200*b*, and storage devices 2300*a* and 2300*b*, and may further include one or more of an image capturing device 2410, a user input device 2420, a sensor 2430, a communication device 2440, a display 2450, a speaker 2460, a power supplying device 2470, and a connecting interface 2480.

The main processor 2100 may control an overall operation of the system 2000, and more specifically, operations of other components forming the system 2000. The main processor 2100 may be implemented as a general-purpose processor, a dedicated processor, or an application processor.

The main processor 2100 may include one or more central processing unit (CPU) cores 2110, and may further include a controller 2120 for controlling the memories 2200*a* and 2200*b* and/or the storage devices 2300*a* and 2300*b*. According to some example embodiments, the main processor 2100 may further include an accelerator 2130 that is a dedicated circuit for high-speed data operation such as artificial intelligence (AI) data operation. The accelerator 2130 may include a graphics processing unit (GPU), a neural processing unit (NPU), and/or a data processing unit (DPU), and may be implemented as a separate chip that is physically independent of other components of the main processor 2100.

The memories 2200*a* and 2200*b* may be used as a main memory device of the system 2000, may include volatile memory such as SRAM and/or DRAM, but may also include non-volatile memory such as flash memory, PRAM, and/or RRAM. The memories 2200*a* and 2200*b* may also be implemented in the same package as the main processor 2100.

The storage devices 2300*a* and 2300*b* may function as a non-volatile storage device storing data regardless of whether power is supplied or not, and may have a relatively large storage capacity compared to the memories 2200*a* and 2200*b*. The storage devices 2300*a* and 2300*b* may include storage controllers 2310*a* and 2310*b* and non-volatile memories 2320*a* and 2320*b* storing data under the control of the storage controllers 2310*a* and 2310*b*. The non-volatile memories 2320*a* and 2320*b* may include flash memory with a two-dimensional (2D) structure or a three-dimensional (3D) vertical NAND (VNAND) structure, but may include other types of non-volatile memories such as PRAM and/or RRAM.

The storage devices 2300*a* and 2300*b* may be included in the system 2000 while being physically separated from the main processor 2100, or may be implemented in the same package as the main processor 2100. In addition, the storage devices 2300*a* and 2300*b* have a form such as an SSD or a memory card to be detachably combined with other components of the system 2000 through an interface such as the connecting interface 2480 to be described later. The storage devices 2300*a* and 2300*b* may be devices to which a standard protocol such as universal flash storage (UFS), embedded multi-media card (eMMC), or non-volatile memory express (NVMe) is applied, but are not limited thereto.

The image capturing device 2410 may capture a still image or a moving image, and may be a camera, a camcorder, and/or a webcam.

The user input device 2420 may receive various types of data input from a user of the system 2000, and may be a touch pad, a keypad, a keyboard, a mouse, and/or a microphone.

The sensor 2430 may detect various types of physical quantities that may be obtained from outside the system 2000 and may convert the detected physical quantities into electrical signals. The sensor 2430 may be a temperature sensor, a pressure sensor, an illuminance sensor, a position sensor, an acceleration sensor, a biosensor, and/or a gyroscope sensor.

The communication device 2440 may transmit and receive signals between other devices outside the system 2000 according to various communication protocols. The communication device 2440 may include an antenna, a transceiver, and/or a modem.

The display 2450 and the speaker 2460 may function as output devices outputting visual information and auditory information to the user of the system 2000, respectively.

The power supply device 2470 may appropriately convert power supplied from a battery (not shown) built into the system 2000 and/or an external power source and may supply the converted power to each component of the system 2000.

The connecting interface 2480 may provide a connection between the system 2000 and an external device connected to the system 2000 to exchange data with the system 2000. The connecting interface 2480 may be implemented in various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, universal serial bus (USB), secure digital (SD) card, MMC, eMMC, UFS, embedded universal flash storage (eUFS), and compact flash (CF) card interface.

Figure 10:
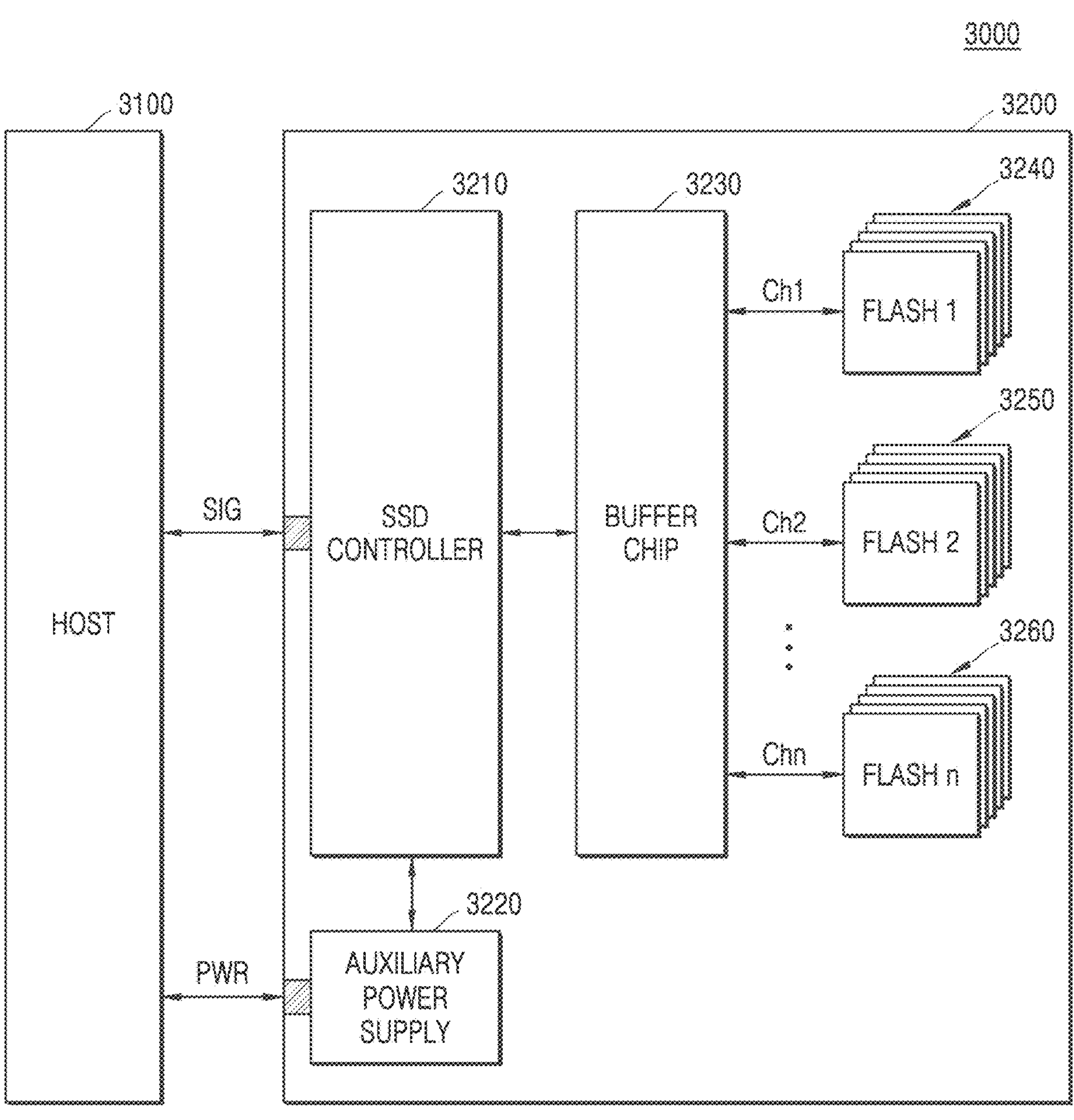
FIG. 10 is a block diagram illustrating an example of a solid-state drive (SSD) system including a memory system according to some example embodiments.

FIG. 10 is a block diagram illustrating an example of a solid state drive (SSD) system 3000 including a memory system according to some example embodiments.

Referring to FIG. 10, the SSD system 3000 may include a host 3100 and an SSD 3200. The SSD 3200 transmits and receives signals to and from the host 3100 through a signal connector and receives power through a power connector. The SSD 3200 may include an SSD controller 3210, an auxiliary power supply 3220, a buffer chip 3230, and memory devices 3240, 3250, and 3260. At this time, the SSD 3200 may be implemented using the embodiments described above with reference to FIGS. 1 to 9.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about"

or “substantially,” it will be understood that these values and shapes should be construed as including a manufacturing or operational tolerance (e.g., ±10%) around the stated numerical values or shapes.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

While the inventive concepts have been particularly shown and described with reference to embodiments thereof, it will be understood that various changes in form and details may be made therein without departing from the spirit and scope of the following claims.

What is claimed is:

1. A memory system comprising:

a buffer chip;

a memory controller configured to transmit and receive a data strobe signal and a data signal to and from the buffer chip; and a plurality of non-volatile memory devices configured to transmit and receive the data strobe signal and the data signal to and from the buffer chip, each non-volatile memory device including a memory interface circuit comprising a plurality of data pins and a data strobe pin, each data pin connected to a corresponding data signal line, the data signal line configured to carry one of bit values for each bit position of the data signal, and the data strobe pin connected to a data strobe signal line configured to carry the data strobe signal, the memory interface circuit further including a plurality of input circuits, and each input circuit comprising a first input buffer connected to a corresponding data pin, a second input buffer connected to the data strobe pin, a repeater configured to delay an output signal of the first input buffer, a first loop configured to correct a voltage offset of each of the first input buffer and the second input buffer, and a second loop configured to correct a delay offset of the repeater.

2. The memory system of claim 1, wherein, based on the memory system operating in a training mode, the input circuit is configured to correct the voltage offset of each of the first input buffer and the second input buffer through the first loop in a first period.

3. The memory system of claim 1, wherein the first loop comprises a 1-1st loop for the first input buffer and a 1-2nd loop for the second input buffer, the 1-1st loop is connected to an output terminal and a control terminal of the first input buffer, and the 1-2nd loop is connected to an output terminal and a control terminal of the second input buffer.

4. The memory system of claim 1, wherein the first input buffer comprises a first input terminal connected to the corresponding data pin and a second input terminal connected to a reference voltage pin, and the input circuit is configured to determine a polarity of the voltage offset of the first input buffer based on an output signal of the first input buffer output by applying voltages at a same voltage level to the first input terminal and the second input terminal, respectively, and correct the voltage offset of the first input buffer in a direction opposite to the determined polarity.

5. The memory system of claim 4, wherein the same voltage level is a ground voltage level.

6. The memory system of claim 1, wherein, based on the memory system operating in a training mode, the input circuit is configured to correct the delay offset of the repeater through the second loop in a second period.

7. The memory system of claim 1, wherein the input circuit further comprises a flip-flop, an input terminal of the flip-flop is connected to an output terminal of the repeater, and a clock signal receiving terminal of the flip-flop is connected to an output terminal of the second input buffer, and the second loop is connected to an output terminal of the flip-flop and a control terminal of the repeater.

8. The memory system of claim 7, wherein the input circuit is configured to monitor an output signal of the flip-flop output by applying toggle pattern signals of the same phase to the first input buffer and the second input buffer and correct the delay offset of the repeater based on a monitoring result.

9. The memory system of claim 8, wherein the input circuit is configured to increase the delay offset of the repeater based on a logic value represented by an output signal of the flip-flop being logic high and reduce the delay offset of the repeater based on a logic value represented by an output signal of the flip-flop being logic low.

10. A memory interface circuit comprising:

a plurality of data pins and a data strobe pin, each data pin connected to a corresponding data signal line, the data signal line configured to carry one of bit values for each bit position of a data signal, and the data strobe pin connected to a data strobe signal line configured to carry a data strobe signal, the memory interface circuit further includes a plurality of input circuits, and each input circuit including a first input buffer connected to a corresponding data pin, a second input buffer connected to the data strobe pin, a repeater configured to delay an output signal of the first input buffer, a first loop configured to correct a voltage offset of each of the first input buffer and the second input buffer, and a second loop configured to correct a delay offset of the repeater.

11. The memory interface circuit of claim 10, wherein, based on the memory interface circuit operating in a training mode, the input circuit is configured to correct the voltage offset of each of the first input buffer and the second input buffer through the first loop in a first period.

12. The memory interface circuit of claim 10, wherein the first loop comprises a 1-1st loop for the first input buffer and a 1-2nd loop for the second input buffer, the 1-1st loop is connected to an output terminal and a control terminal of the first input buffer, and the 1-2nd loop is connected to an output terminal and a control terminal of the second input buffer.

13. The memory interface circuit of claim 10, wherein the first input buffer comprises a first input terminal connected to the corresponding data pin and a second input terminal connected to a reference voltage pin, and the input circuit is configured to determine a polarity of the voltage offset of the first input buffer based on an output signal of the first input buffer output by applying voltages at a same voltage level to the first input terminal and the second input terminal, respectively, and to correct the voltage offset of the first input buffer in a direction opposite to the determined polarity.

14. The memory interface circuit of claim 13, wherein the same voltage level is a ground voltage level.

15. The memory interface circuit of claim 10, wherein, based on the memory interface circuit operating in a training mode, the input circuit is configured to correct the delay offset of the repeater through the second loop in a second period.

16. The memory interface circuit of claim 10, wherein the input circuit further comprises a flip-flop, an input terminal of the flip-flop is connected to an output terminal of the repeater, and a clock signal receiving terminal of the flip-flop is connected to an output terminal of the second input buffer, and the second loop is connected to an output terminal of the flip-flop and a control terminal of the repeater.

17. The memory interface circuit of claim 16, wherein the input circuit is configured to monitor an output signal of the flip-flop output by applying toggle pattern signals of the same phase to the first input buffer and the second input buffer and to correct the delay offset of the repeater based on a monitoring result.

18. The memory interface circuit of claim 17, wherein the input circuit is configured to increase the delay offset of the repeater based on a logic value represented by an output signal of the flip-flop being logic high and reduce the delay offset of the repeater based on a logic value represented by an output signal of the flip-flop being logic low.

19. An input circuit comprising:

a first input buffer connected to a corresponding data pin, a second input buffer connected to a data strobe pin, and a repeater configured to delay an output signal of the first input buffer, a first loop configured to correct a voltage offset of each of the first input buffer and the second input buffer, and a second loop configured to correct a delay offset of the repeater.

20. The input circuit of claim 19, wherein the input circuit is configured to correct the voltage offset of each of the first input buffer and the second input buffer through the first loop in a first period.

* * * * *